United States Patent
Lindenberg

(10) Patent No.: US 10,332,934 B2
(45) Date of Patent: Jun. 25, 2019

(54) MEMORY ARRAYS AND METHODS OF FORMING MEMORY ARRAYS

(71) Applicant: Micron Technology, Inc., Boise, ID (US)

(72) Inventor: Tony M. Lindenberg, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/854,534

(22) Filed: Dec. 26, 2017

(65) Prior Publication Data

US 2018/0138238 A1 May 17, 2018

Related U.S. Application Data

(62) Division of application No. 14/242,588, filed on Apr. 1, 2014, now Pat. No. 9,881,971.

(51) Int. Cl.
*H01L 21/00* (2006.01)
*H01L 27/24* (2006.01)
*H01L 45/00* (2006.01)

(52) U.S. Cl.
CPC ...... *H01L 27/2463* (2013.01); *H01L 27/2481* (2013.01); *H01L 45/06* (2013.01);
(Continued)

(58) Field of Classification Search
CPC .......................... H01L 45/126; H01L 45/1233
See application file for complete search history.

(56) References Cited

U.S. PATENT DOCUMENTS

| 4,080,719 A | 3/1978 | Wilting |
| 4,499,557 A | 2/1985 | Holmberg |

(Continued)

FOREIGN PATENT DOCUMENTS

| EP | 1285069.9 | 6/2015 |
| EP | 14749460 | 7/2016 |

(Continued)

OTHER PUBLICATIONS

Bez, "Chalcogenide PCM: a Memory Technology for Next Decade", IEEE Interntaional Electron Devices Meeting (IEDM), Dec. 2009, United States, pp. 5.1.1-5.1.4.
(Continued)

*Primary Examiner* — Wael M Fahmy
*Assistant Examiner* — Sarah K Salerno
(74) *Attorney, Agent, or Firm* — Wells St. John P.S.

(57) ABSTRACT

Some embodiments include a memory array which has a first series of access/sense lines extending along a first direction, and a second series of access/sense lines over the first series of access/sense lines and extending along a second direction which crosses the first direction. Memory cells are vertically between the first and second series of access/sense lines. Each memory cell is uniquely addressed by a combination of an access/sense line from the first series and an access/sense line from the second series. Resistance-increasing material is adjacent to and coextensive with the access/sense lines of one of the first and second series, and is between the adjacent access/sense lines and programmable material of the memory cells. Some embodiments include methods of forming memory arrays.

18 Claims, 18 Drawing Sheets

(52) U.S. Cl.
CPC ........ *H01L 45/126* (2013.01); *H01L 45/1253* (2013.01); *H01L 45/141* (2013.01); *H01L 45/144* (2013.01); *H01L 45/1675* (2013.01)

(56) References Cited

U.S. PATENT DOCUMENTS

| | | | |
|---|---|---|---|
| 4,752,118 A | 6/1988 | Johnson | |
| 4,849,247 A | 7/1989 | Scanlon et al. | |
| 4,987,099 A | 1/1991 | Flanner | |
| 5,055,423 A | 10/1991 | Smith et al. | |
| 5,166,758 A | 11/1992 | Ovshinsky et al. | |
| 5,168,332 A | 12/1992 | Kunishima et al. | |
| 5,341,328 A | 8/1994 | Ovshinsky et al. | |
| 5,895,963 A | 4/1999 | Yamazaki | |
| 5,912,839 A | 6/1999 | Ovshinsky et al. | |
| 6,143,670 A | 11/2000 | Cheng et al. | |
| 6,579,760 B1* | 6/2003 | Lung | G11C 11/56 257/E27.004 |
| 6,611,453 B2 | 8/2003 | Ning | |
| 6,613,604 B2 | 9/2003 | Maimon et al. | |
| 6,661,330 B1 | 12/2003 | Young | |
| 6,664,182 B2 | 12/2003 | Jeng | |
| 6,692,898 B2 | 2/2004 | Ning | |
| 6,700,211 B2 | 3/2004 | Gonzalez et al. | |
| 6,764,894 B2 | 7/2004 | Lowrey | |
| 6,815,704 B1 | 11/2004 | Chen | |
| 6,906,940 B1 | 6/2005 | Lue | |
| 7,148,140 B2 | 12/2006 | Leavy et al. | |
| 7,169,624 B2 | 1/2007 | Hsu | |
| 7,332,401 B2 | 2/2008 | Moore et al. | |
| 7,422,926 B2 | 9/2008 | Pellizzer et al. | |
| 7,453,111 B2 | 11/2008 | Ryoo et al. | |
| 7,619,933 B2 | 11/2009 | Sarin | |
| 7,638,787 B2 | 12/2009 | An et al. | |
| 7,646,631 B2 | 1/2010 | Lung | |
| 7,719,039 B2 | 5/2010 | Muralidhar et al. | |
| 7,772,680 B2 | 8/2010 | Manning | |
| 7,773,413 B2 | 8/2010 | Shalvi | |
| 7,785,978 B2 | 8/2010 | Smythe | |
| 7,800,092 B2 | 9/2010 | Liu et al. | |
| 7,803,655 B2 | 9/2010 | Johnson et al. | |
| 7,838,341 B2 | 11/2010 | Dennison | |
| 7,867,832 B2 | 1/2011 | Yang et al. | |
| 7,888,711 B2 | 2/2011 | Cheung et al. | |
| 7,915,602 B2 | 3/2011 | Sato | |
| 7,919,766 B2 | 4/2011 | Lung | |
| 7,935,553 B2 | 5/2011 | Scheuerlein et al. | |
| 7,974,115 B2 | 7/2011 | Jeong et al. | |
| 8,013,319 B2 | 9/2011 | Chang | |
| 8,022,382 B2 | 9/2011 | Lai et al. | |
| 8,110,822 B2 | 2/2012 | Chen | |
| 8,486,743 B2 | 7/2013 | Bresolin et al. | |
| 8,507,353 B2 | 8/2013 | Oh et al. | |
| 8,546,231 B2 | 10/2013 | Pellizzer et al. | |
| 8,614,433 B2 | 12/2013 | Lee et al. | |
| 8,723,155 B2 | 5/2014 | Redaelli et al. | |
| 8,765,555 B2 | 7/2014 | Van Gerpen | |
| 8,822,969 B2 | 9/2014 | Hwang | |
| 9,299,930 B2 | 3/2016 | Redaelli | |
| 9,673,393 B2 | 6/2017 | Pellizzer | |
| 2002/0017701 A1 | 2/2002 | Klersy et al. | |
| 2002/0173101 A1 | 11/2002 | Shau | |
| 2002/0177292 A1 | 11/2002 | Dennison | |
| 2004/0178425 A1 | 9/2004 | Kato | |
| 2004/0188668 A1 | 9/2004 | Hamann et al. | |
| 2004/0195604 A1 | 10/2004 | Hwang et al. | |
| 2005/0001212 A1 | 1/2005 | Matsui | |
| 2005/0006681 A1 | 1/2005 | Okuno | |
| 2005/0110983 A1 | 5/2005 | Jeong et al. | |
| 2005/0117397 A1 | 6/2005 | Morimoto | |
| 2005/0162881 A1 | 7/2005 | Stasiak | |
| 2005/0243596 A1 | 11/2005 | Symanczyk | |
| 2006/0073631 A1 | 4/2006 | Karpov et al. | |
| 2006/0073652 A1 | 4/2006 | Pellizzer et al. | |
| 2006/0076548 A1 | 4/2006 | Park et al. | |
| 2006/0110888 A1 | 5/2006 | Cho et al. | |
| 2006/0113520 A1 | 6/2006 | Yamamoto et al. | |
| 2006/0157679 A1 | 7/2006 | Scheuerlein | |
| 2006/0157682 A1 | 7/2006 | Scheuerlein | |
| 2006/0186440 A1 | 8/2006 | Wang et al. | |
| 2006/0226409 A1 | 10/2006 | Burr | |
| 2006/0284279 A1 | 12/2006 | Lung et al. | |
| 2006/0286709 A1 | 12/2006 | Lung et al. | |
| 2007/0008773 A1 | 1/2007 | Scheuerlein | |
| 2007/0012905 A1 | 1/2007 | Huang | |
| 2007/0029676 A1 | 2/2007 | Takaura et al. | |
| 2007/0054486 A1 | 3/2007 | Yang | |
| 2007/0075347 A1 | 4/2007 | Lai et al. | |
| 2007/0075359 A1 | 4/2007 | Yoon et al. | |
| 2007/0108431 A1 | 5/2007 | Chen et al. | |
| 2007/0158698 A1 | 7/2007 | Dennison et al. | |
| 2007/0224726 A1 | 9/2007 | Chen et al. | |
| 2007/0235708 A1 | 10/2007 | Elmgreen et al. | |
| 2007/0272913 A1 | 11/2007 | Scheuerlein | |
| 2007/0279974 A1 | 12/2007 | Dennison et al. | |
| 2007/0285969 A1 | 12/2007 | Toda et al. | |
| 2008/0014733 A1 | 1/2008 | Liu | |
| 2008/0017842 A1 | 1/2008 | Happ et al. | |
| 2008/0043520 A1 | 2/2008 | Chen | |
| 2008/0054470 A1 | 3/2008 | Amano et al. | |
| 2008/0064200 A1 | 3/2008 | Johnson et al. | |
| 2008/0067485 A1 | 3/2008 | Besana et al. | |
| 2008/0067486 A1 | 3/2008 | Karpov et al. | |
| 2008/0093703 A1 | 4/2008 | Yang et al. | |
| 2008/0101109 A1 | 5/2008 | Haring-Bolivar et al. | |
| 2008/0105862 A1 | 5/2008 | Lung et al. | |
| 2008/0123394 A1 | 5/2008 | Lee et al. | |
| 2008/0128677 A1 | 6/2008 | Park et al. | |
| 2008/0137400 A1 | 6/2008 | Chen et al. | |
| 2008/0138929 A1 | 6/2008 | Lung | |
| 2008/0157053 A1 | 7/2008 | Lai et al. | |
| 2008/0197394 A1 | 8/2008 | Caspary et al. | |
| 2009/0008621 A1 | 1/2009 | Lin et al. | |
| 2009/0017577 A1 | 1/2009 | An et al. | |
| 2009/0032794 A1 | 2/2009 | Hsiao | |
| 2009/0039333 A1 | 2/2009 | Chang et al. | |
| 2009/0072213 A1 | 3/2009 | Elmgreen et al. | |
| 2009/0072341 A1 | 3/2009 | Liu et al. | |
| 2009/0091971 A1 | 4/2009 | Dennison et al. | |
| 2009/0101883 A1 | 4/2009 | Lai et al. | |
| 2009/0108247 A1 | 4/2009 | Takaura et al. | |
| 2009/0115020 A1 | 5/2009 | Yang et al. | |
| 2009/0127538 A1 | 5/2009 | Ryoo et al. | |
| 2009/0147564 A1 | 6/2009 | Lung | |
| 2009/0166601 A1 | 7/2009 | Czubatyj et al. | |
| 2009/0194757 A1 | 8/2009 | Lam et al. | |
| 2009/0194758 A1 | 8/2009 | Chen | |
| 2009/0230378 A1 | 9/2009 | Ryoo et al. | |
| 2009/0230505 A1 | 9/2009 | Dennison | |
| 2009/0298222 A1 | 12/2009 | Lowrey et al. | |
| 2009/0302300 A1 | 12/2009 | Chang et al. | |
| 2009/0321706 A1 | 12/2009 | Happ et al. | |
| 2010/0001248 A1 | 1/2010 | Wouters et al. | |
| 2010/0001253 A1 | 1/2010 | Arnold et al. | |
| 2010/0019221 A1 | 1/2010 | Lung et al. | |
| 2010/0054029 A1 | 3/2010 | Happ et al. | |
| 2010/0055830 A1 | 3/2010 | Chen et al. | |
| 2010/0065530 A1 | 3/2010 | Walker et al. | |
| 2010/0065804 A1 | 3/2010 | Park | |
| 2010/0072447 A1 | 3/2010 | Lung | |
| 2010/0072453 A1 | 3/2010 | Jeong et al. | |
| 2010/0107403 A1 | 5/2010 | Aubel et al. | |
| 2010/0151652 A1 | 6/2010 | Lung et al. | |
| 2010/0163830 A1 | 7/2010 | Chang et al. | |
| 2010/0163833 A1 | 7/2010 | Borghi et al. | |
| 2010/0165719 A1 | 7/2010 | Pellizzer | |
| 2010/0171188 A1 | 7/2010 | Lung et al. | |
| 2010/0176368 A1 | 7/2010 | Ko et al. | |
| 2010/0176911 A1 | 7/2010 | Park et al. | |
| 2010/0203672 A1* | 8/2010 | Eun | H01L 27/2409 438/102 |
| 2010/0207168 A1 | 8/2010 | Sills et al. | |
| 2010/0213431 A1 | 8/2010 | Yeh et al. | |
| 2010/0221874 A1 | 9/2010 | Kuo et al. | |

(56) References Cited

U.S. PATENT DOCUMENTS

| | | |
|---|---|---|
| 2010/0243980 A1 | 9/2010 | Fukumizu |
| 2010/0254175 A1 | 10/2010 | Scheuerlein |
| 2010/0270529 A1 | 10/2010 | Lung |
| 2010/0301303 A1 | 12/2010 | Wang et al. |
| 2010/0301304 A1 | 12/2010 | Chen et al. |
| 2010/0301417 A1 | 12/2010 | Cheng et al. |
| 2010/0308296 A1 | 12/2010 | Pirovano et al. |
| 2010/0323490 A1 | 12/2010 | Sreenivasan et al. |
| 2010/0327251 A1 | 12/2010 | Park |
| 2011/0001114 A1 | 1/2011 | Zanderighi et al. |
| 2011/0031461 A1 | 2/2011 | Kang et al. |
| 2011/0068318 A1 | 3/2011 | Ishibashi et al. |
| 2011/0074538 A1 | 3/2011 | Wu et al. |
| 2011/0092041 A1 | 4/2011 | Lai et al. |
| 2011/0155984 A1 | 6/2011 | Redaelli et al. |
| 2011/0155985 A1 | 6/2011 | Oh et al. |
| 2011/0193042 A1 | 8/2011 | Maxwell |
| 2011/0193049 A1 | 8/2011 | Iwakaji et al. |
| 2011/0215436 A1 | 9/2011 | Tang et al. |
| 2011/0284815 A1 | 11/2011 | Kim et al. |
| 2011/0300685 A1 | 12/2011 | Horii et al. |
| 2011/0312178 A1 | 12/2011 | Watanabe et al. |
| 2012/0091422 A1 | 4/2012 | Choi et al. |
| 2012/0126196 A1 | 5/2012 | Pio |
| 2012/0241705 A1 | 9/2012 | Tang et al. |
| 2012/0248504 A1 | 10/2012 | Liu |
| 2012/0256150 A1 | 10/2012 | Zagrebelny et al. |
| 2012/0256151 A1 | 10/2012 | Liu et al. |
| 2012/0273742 A1 | 11/2012 | Minemura |
| 2012/0305875 A1 | 12/2012 | Shim |
| 2012/0313067 A1 | 12/2012 | Lee |
| 2013/0099888 A1 | 4/2013 | Redaelli et al. |
| 2013/0126812 A1 | 5/2013 | Redaelli |
| 2013/0126816 A1 | 5/2013 | Tang et al. |
| 2013/0126822 A1 | 5/2013 | Pellizzer et al. |
| 2013/0277796 A1 | 10/2013 | Yang et al. |
| 2013/0285002 A1 | 10/2013 | Van Gerpen et al. |
| 2014/0117302 A1 | 5/2014 | Goswami |
| 2014/0206171 A1 | 7/2014 | Redaelli |
| 2014/0217350 A1 | 8/2014 | Liu et al. |
| 2015/0279906 A1 | 10/2015 | Lindenberg et al. |
| 2015/0349255 A1 | 12/2015 | Pellizzer et al. |
| 2015/0357380 A1 | 12/2015 | Pellizzer |
| 2016/0111638 A1 | 4/2016 | Wells |

FOREIGN PATENT DOCUMENTS

| | | |
|---|---|---|
| WO | WO 2005/041196 | 5/2005 |
| WO | WO 2010/073904 | 7/2010 |
| WO | PCT/US2012/063962 | 3/2013 |
| WO | PCT/US2012/063962 | 5/2014 |
| WO | PCT/US2014/011250 | 5/2014 |
| WO | WO 2013/039496 | 5/2014 |
| WO | PCT/US2014/011250 | 8/2015 |

OTHER PUBLICATIONS

Czubatyj et al., "Current Reduction in Ovonic Memory Devices", downloaded prior to Nov. 17, 2011 from www.epcos.org/library/papers/pdC2006/pdf.../Czubatyj.pdf, 10 pages.

Fazio, "Future Directions of Non-Volatile Memory in Compute Applications", IEEE International Electron Devices Meeting (IEDM), Dec. 2009, United States, pp. 27.7.1-27.7.4.

Happ et al., "Novel One-Mask Self-Heating Pillar Phase Change Memory", IEEE Symposium on 5 VLSI Technology Digest of Technical Papers, 2006, United States, 2 pages.

Lee et al., "Programming Disturbance and Cell Scaling in Phase Change Memory: For up to 16nm based 4F2 Cell", IEEE Symposium on VLSI Technology Digest of Technical Papers, 2010, United States, pp. 199-200.

Raoux et al., "Effect of Ion Implantation on Crystallization Properties of Phase Change Materials", presented at E\PCOS2010 Conference, Sep. 6-7, 2010, Politecnico di Milano, Milan, IT, 8 pages.

Russo et al., "Modeling of Programming and Read Performance in Phase-Change Memories—Part II: Program Disturb and Mixed-Scaling Approach", IEEE Transactions on Electron Devices, vol. 55(2), Feb. 2008, pp. 515-522.

Servalli, "A 45nm Generation Phase Change Memory Technology", IEEE International Electron Devices Meeting (IEDM), Dec. 2009, United States, pp. IEDM09-113-IEDM09-116.

Villa et al., "A 45nm 1Gb 1.8V Phase-Change Memory", IEEE International Solid-State Circuits Conference, Feb. 9, 2010, United States, pp. 270-271.

\* cited by examiner

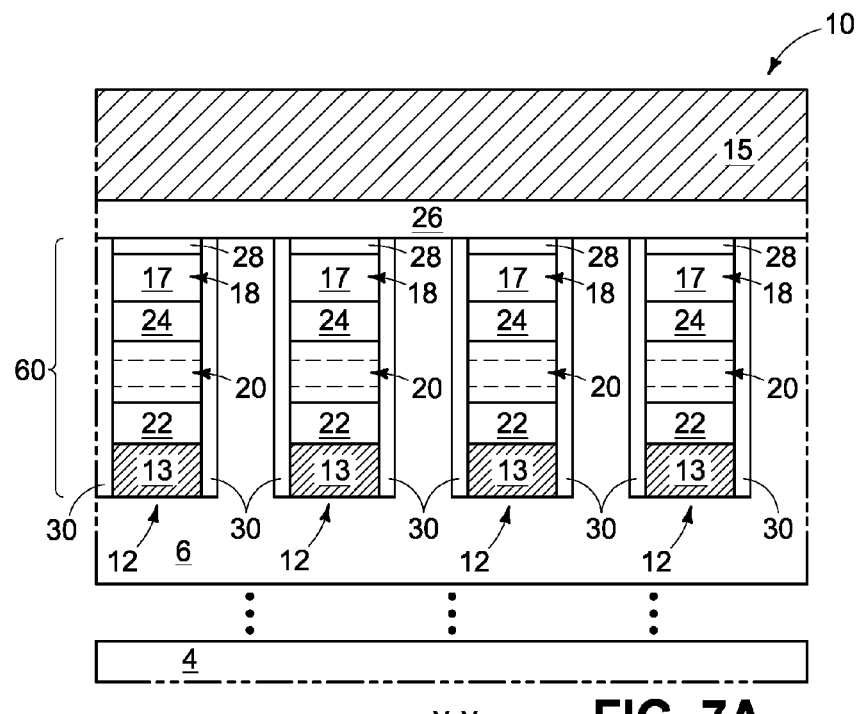
y-y  FIG. 7A
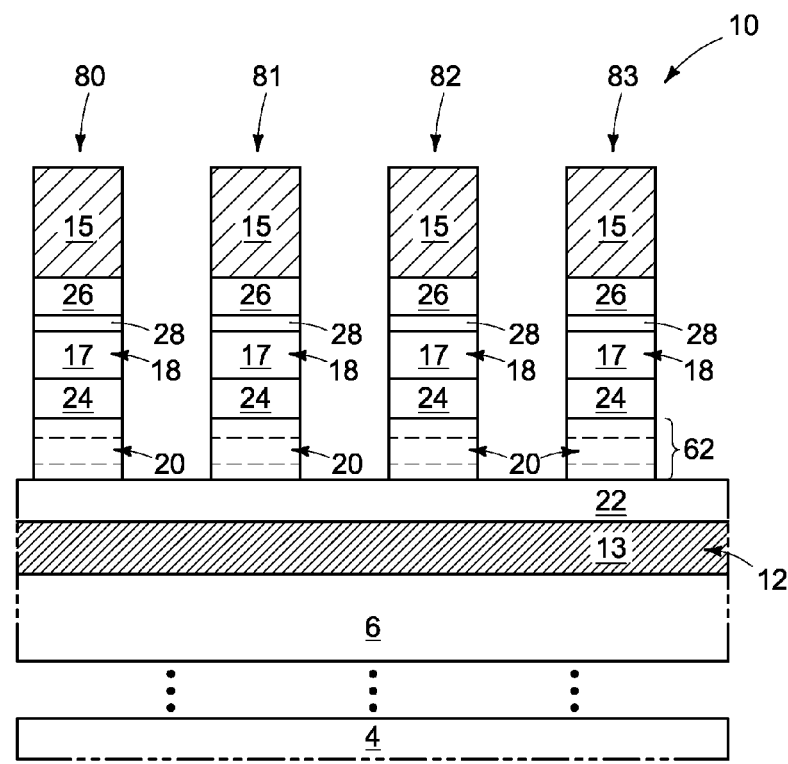
x-x  FIG. 7B

MEMORY ARRAYS AND METHODS OF FORMING MEMORY ARRAYS

RELATED PATENT DATA

This patent resulted from a divisional of U.S. patent application Ser. No. 14/242,588, which was filed Apr. 1, 2014 and which is hereby incorporated by reference herein.

TECHNICAL FIELD

Memory arrays and methods of forming memory arrays.

BACKGROUND

Memory is one type of integrated circuitry, and is used in systems for storing data. Memory is usually fabricated in one or more arrays of individual memory cells. The memory cells are configured to retain or store information in at least two different selectable states. In a binary system, the states are considered as either a "0" or a "1". In other systems, at least some individual memory cells may be configured to store more than two levels or states of information.

Integrated circuit fabrication continues to strive to produce smaller and denser integrated circuits. Accordingly, there has been substantial interest in memory cells that can be utilized in structures having programmable material between a pair of electrodes; where the programmable material has two or more selectable resistive states to enable storing of information. Examples of such memory cells are resistive RAM (RRAM) cells, phase change RAM (PCRAM) cells, and programmable metallization cells (PMCs)—which may be alternatively referred to as a conductive bridging RAM (CBRAM) cells, nanobridge memory cells, or electrolyte memory cells. The memory cell types are not mutually exclusive. For example, RRAM may be considered to encompass PCRAM and PMCs. Additional example memory includes ferroelectric memory, magnetic RAM (MRAM) and spin-torque RAM.

It would be desirable to develop improved memory arrays, and improved methods of forming memory arrays.

BRIEF DESCRIPTION OF THE DRAWINGS

FIGS. 7, 7A and 7B are a top view and a pair of cross-sectional side views of the semiconductor construction of FIGS. 3, 3A and 3B at a processing stage subsequent to that of FIGS. 6, 6A and 6B. The views of FIGS. 7A and 7B are along the lines y-y and x-x of FIG. 7, respectively.

DETAILED DESCRIPTION OF THE ILLUSTRATED EMBODIMENTS

Some embodiments include memory arrays having resistance-increasing material directly against access/sense lines and coextensive with the access/sense lines. The resistance-increasing material is more resistive than the adjacent access/sense line, and may be utilized to increase resistance along a stack comprising a memory cell. Some embodiments include methods of forming the memory arrays. Example embodiments are described with reference to FIGS. 1-8.

Figure 1:
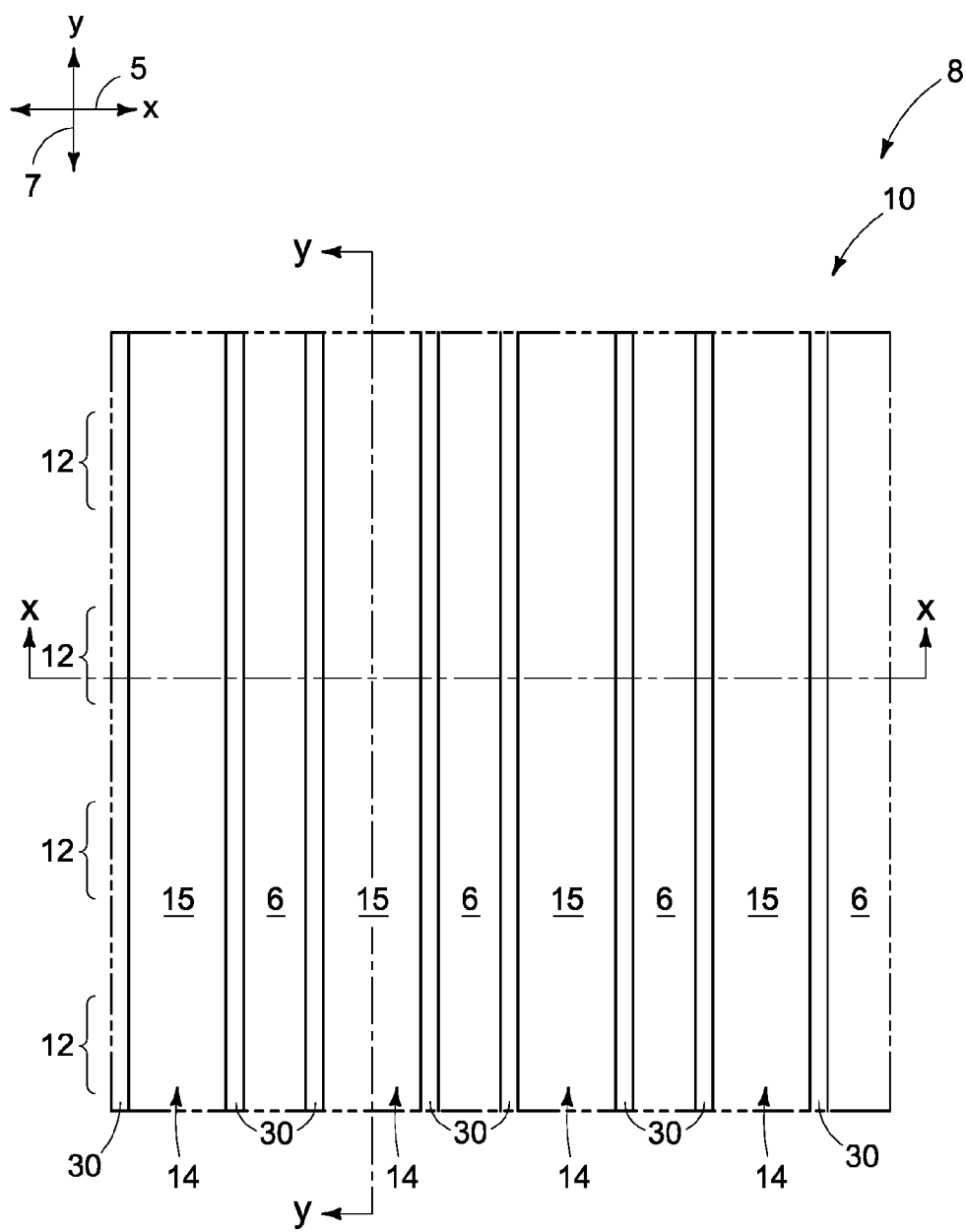
FIGS. 1, 1A and 1B are a top view and a pair of cross-sectional side views of a region of an example embodiment memory array. The views of FIGS. 1A and 1B are along the lines y-y and x-x of FIG. 1, respectively.
Figure 1A:
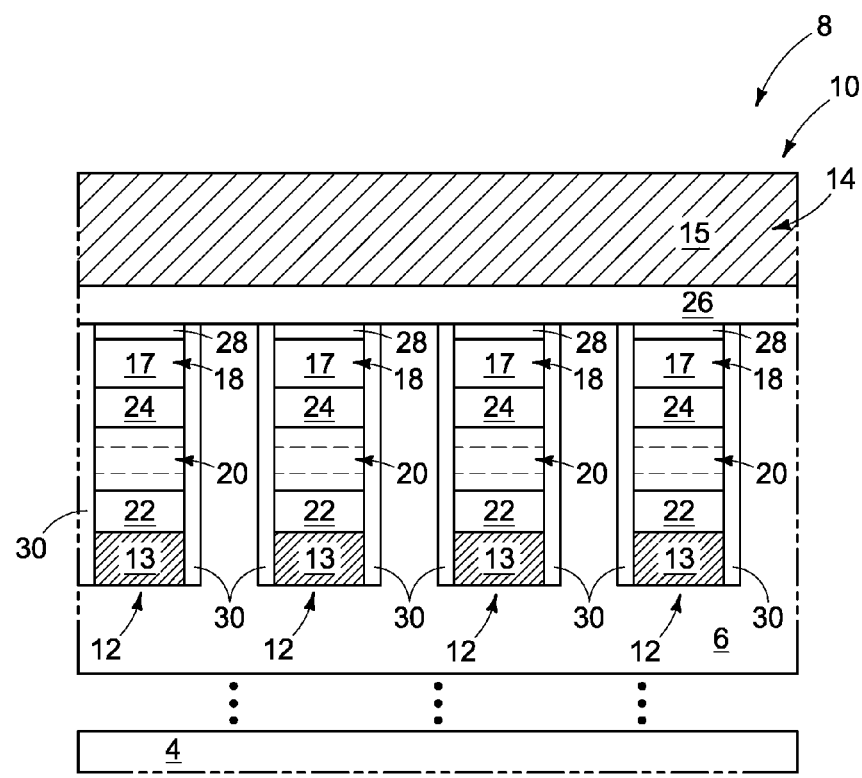
Figure 1B:
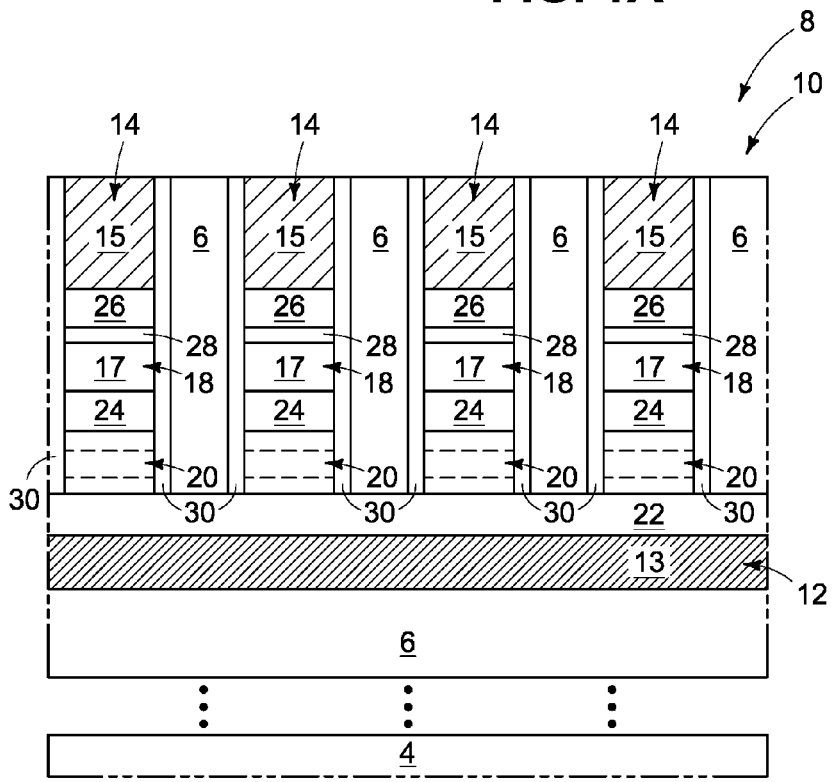

Referring to FIGS. 1, 1A and 1B, a portion of an example embodiment memory array 10 is illustrated as part of a semiconductor construction 8. The construction 8 comprises a semiconductor base 4, and an electrically insulative material 6 supported over the base 4. The insulative material 6 is shown spaced from the base 4 to indicate that there may be one or more other materials and/or integrated circuit levels between the base 4 and the insulative material 6.

The base 4 may comprise semiconductor material, and in some embodiments may comprise, consist essentially of, or consist of monocrystalline silicon. In some embodiments, base 4 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base 4 may correspond to a semiconductor substrate containing one or more materials associated with integrated circuit fabrication. Some of the materials may be between the shown region of base 4 and the insulative material 6 and/or may be laterally adjacent the shown region of base 4; and may correspond to, for example, one or more of refractory metal materials, barrier materials, diffusion materials, insulator materials, etc.

The insulative material 6 may comprise any suitable composition or combination of compositions; including, for example, one or more of various oxides (for instance, silicon dioxide, borophosphosilicate glass, etc.), silicon nitride, etc.

The memory array 10 includes a first series of access/sense lines 12 which extend along a first direction represented by axis 5, and a second series of access/sense lines 14 which extend along a second direction represented by axis 7. The first direction crosses the second direction, and in the shown embodiment the first direction is substantially orthogonal to the second direction, (with the term "substantially orthogonal" meaning that the directions are orthogonal to one another within reasonable tolerances of fabrication and measurement).

The access/sense lines 12 and 14 are utilized for addressing memory cells within the array 10; and may be wordlines and bitlines, respectively, in some embodiments.

The access/sense lines 12 are not visible in the top view of FIG. 1. Locations of the lines 12 are diagrammatically illustrated with brackets adjacent the top view.

The first access/sense lines 12 comprise first access/sense line material 13, and the second access/sense lines 14 comprise second access/sense line material 15. The materials 13 and 15 are electrically conductive and may comprise any suitable composition or combination of compositions. In some embodiments, materials 13 and 15 may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.). The materials 13 and 15 may be the same as one another in some embodiments, and may be different from one another in other embodiments.

Programmable material 17 is between the first and second access/sense lines 12 and 14. The programmable material may comprise any suitable material; and in some embodiments may comprise material suitable for being utilized in resistive RAM. For instance, material 17 may comprise phase change material. The phase change material may be any suitable material; and may be, for example, chalcogenide. An example chalcogenide is a material comprising germanium, antimony and tellurium, and commonly referred to as GST; but other suitable chalcogenides are available.

The programmable material 17 is comprised by memory cells 18. In operation, each memory cell is uniquely addressed by the combination of an access/sense line 12 (i.e., an access/sense line from the first series) and an access/sense line 14 (i.e., an access/sense line from the second series).

In the shown embodiment, select devices 20 are provided between the memory cells 18 and the access/sense lines 12. The select devices may be any suitable devices; including, for example, diodes, bipolar junction transistors, field effect transistors, switches, etc. The select devices may comprise multiple different materials, and such is diagrammatically illustrated in FIGS. 1A and 1B using dashed lines to indicate approximate boundaries between various materials.

Resistance-enhancing materials 22, 24 and 26 are provided at various locations between access/sense lines 12 and 14. The materials 22, 24 and 26 may be referred to as first, second and third resistance-enhancing materials, respectively, in some embodiments to distinguish such materials from one another. In the shown embodiment, the first resistance-enhancing material 22 is provided between the access/sense lines 12 and the select devices 20, the second resistance-enhancing material 24 is provided between the select devices 20 and the programmable material 17, and the third resistance-enhancing material 26 is provided between programmable material 17 and access/sense lines 14. Although three resistance-enhancing materials are shown, in other embodiments there may be more than the illustrated three resistance-enhancing materials, or fewer than the illustrated three resistance-enhancing materials. In some embodiments, material 24 may be omitted, and materials 22 and 26 may correspond to first and second resistance-enhancing materials, respectively.

The resistance-enhancing materials have higher resistance than the access/sense lines. In some embodiments, one or more of the resistance-enhancing materials may comprise heater materials (i.e., materials suitable for utilization as heaters in phase change memory); such as, for example, compositions comprising titanium and nitrogen in combination with one or both of silicon and aluminum. In some embodiments, one or more of the resistance-enhancing materials may comprise, consist essentially of, or consist of carbon; such as, for example, carbon deposited utilizing physical vapor deposition methodology.

In some embodiments, the first, second and third resistance-enhancing materials 22, 24 and 26 may be a same composition as one another. In other embodiments, two or more of the resistance-enhancing materials may be different compositions relative to one another.

The resistance-enhancing materials 22, 24 and 26 may be incorporated into the memory array to provide desired electrical properties across memory cells 18 during current flow between the access/sense lines 12 of the first series and the access/sense lines 14 of the second series. Multiple resistance-enhancing materials may be utilized instead of utilizing a single material, in that it may be difficult to form a single material thick enough to achieve desired resistance along the circuit paths between the first access/sense lines 12 and the second access/sense lines 14. As discussed above, memory cells 18 may be any of numerous types of memory cells, and in some embodiments may be memory cells of resistive RAM. In particular embodiments, the programmable material 17 may correspond to phase change material, and the memory cells may be utilized in PCRAM. In such embodiments, the resistance-enhancing material 24 may be utilized as heater material to induce phase changes within material 17 during operation of the memory cells, and the other resistance-enhancing materials 22 and 26 may be utilized to achieve desired overall resistance across the memory cells during operation of the memory array 10.

Notably, the first resistance-enhancing material 22 is directly against the first access/sense lines 12 and is configured as lines coextensive with the first access/sense lines; and the third resistance-enhancing material 26 is directly against the second access/sense lines 14 and is configured as lines coextensive with the second access/sense lines. In some embodiments, resistivity through materials 22 and 26 may be such that the horizontal current flow along the lines of material 22 and 26 is substantially nonexistent, and instead current flow through the materials 22 and 26 is substantially entirely vertically directed during operation of memory array 10.

The configuration of resistive materials 22 and 26 as lines coextensive with adjacent access/sense lines may advantageously simplify and/or otherwise improve fabrication processing relative to other architectures in which one or both of the materials 22 and 26 is configured in a different pattern. For instance, utilization of a common configuration of material 26 relative to the adjacent access/sense lines 14 may enable a single mask to be utilized for fabricating both the resistance/enhancing material 26 and the access/sense material 15. Further, materials 24 and 17 are part of a stack which is patterned into a vertical pillar. If material 26 were also part of such stack, an aspect ratio associated with the patterning of the stack would be greater, which may reduce process margin and/or lead to defects, increased costs, and/or other problems. Similar difficulties may occur if resistance-enhancing material 22 is part of the vertical pillars comprising materials 24 and 17. Example processing for fabricating memory array 10 is described below with reference to FIGS. 3-8.

The illustrated embodiment has a material 28 between resistance-enhancing material 26 and programmable material 17. Material 28 may be a metal-containing material; and in some embodiments may comprise, consist essentially of, or consist of one or more of tungsten, titanium, etc. For instance, the material 28 may comprise titanium silicide or tungsten silicide. Although only a single metal-containing material 28 is illustrated between the programmable material 17 and the resistance-increasing material 26, in other embodiments there may be more than one metal-containing material provided between the materials 17 and 26. In yet other embodiments, material 28 may be omitted and resistance-increasing material 26 may be directly against programmable material 17.

Material 28 may enhance adhesion of resistance-enhancing material 26 and/or may be utilized as a buffer between the material 26 and the programmable material 17 to preclude direct contact of material 26 with material 17 in applications where such direct contact would be problematic (such as, for example, applications in which material 26 is reactive with, or otherwise chemically incompatible with, material 17).

In the illustrated embodiment, additional insulative material 30 is provided along sidewalls of the vertical pillars comprising programmable material 17, and is between such sidewalls and the insulative material 6. The material 30 is an optional material, but may be utilized in embodiments in which it would be problematic for material 6 to directly contact sidewalls of programmable material 17. For instance, in some embodiments programmable material 17 may be an oxygen-sensitive material (for instance, a chalcogenide), insulative material 6 may be an oxygen-containing material (for instance, silicon dioxide), and insulative material 30 may be a non-oxygen-containing barrier (for instance, a material consisting of silicon nitride) provided between materials 17 and 6.

Figure 2:
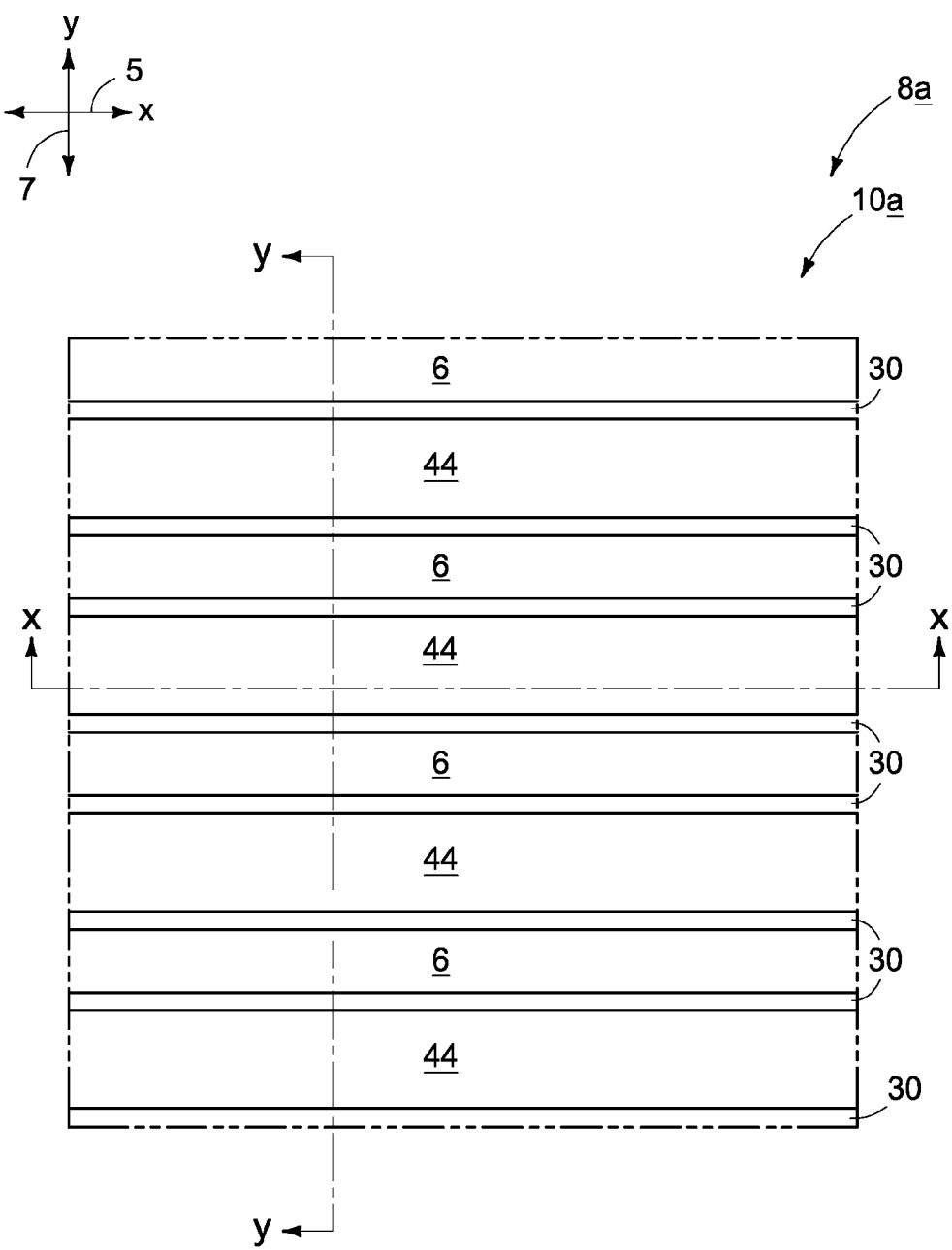
FIGS. 2, 2A and 2B are a top view and a pair of cross-sectional side views of a region of another example embodiment memory array. The views of FIGS. 2A and 2B are along the lines y-y and x-x of FIG. 2, respectively.
Figure 2A:
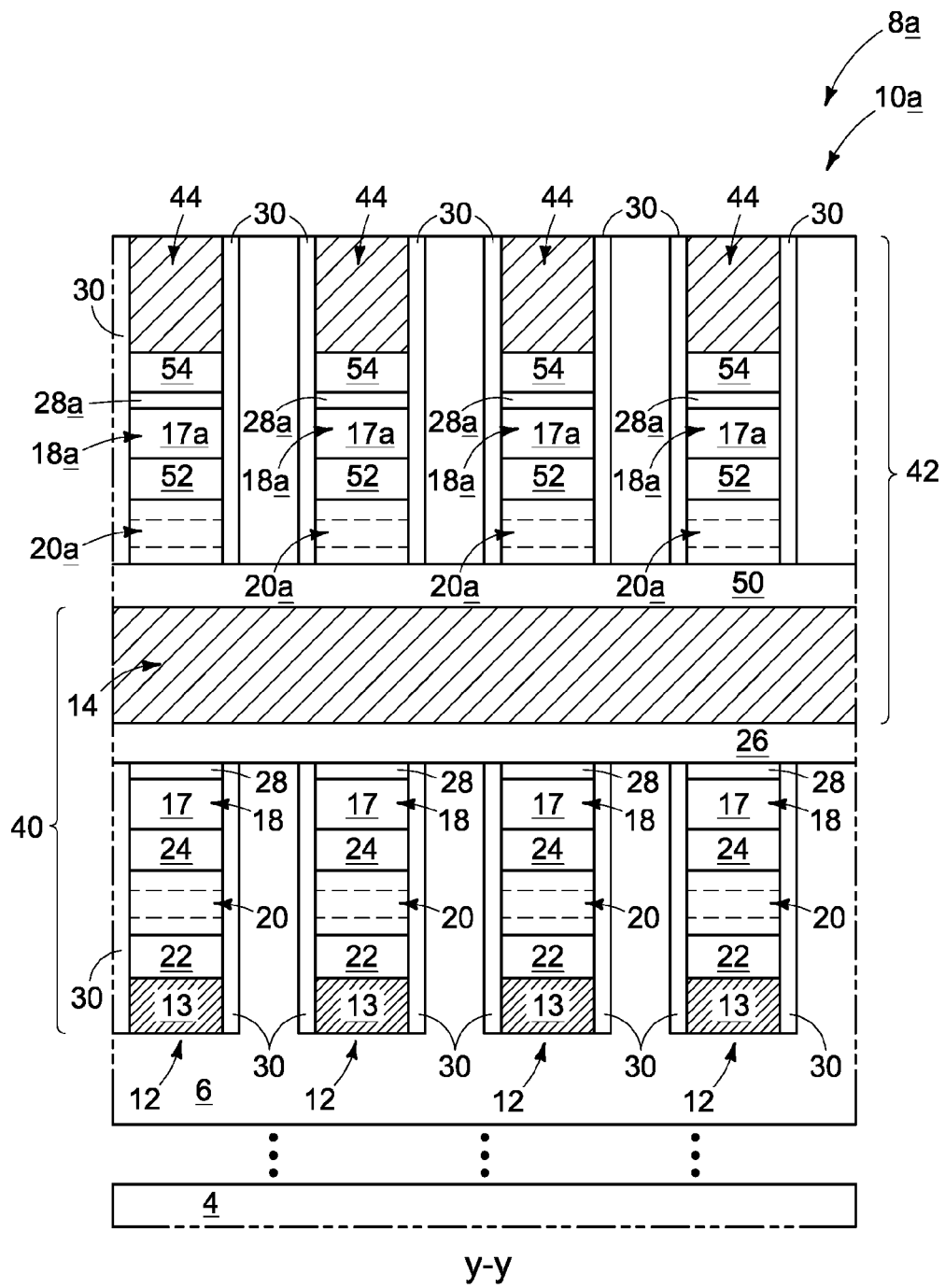
Figure 2B:
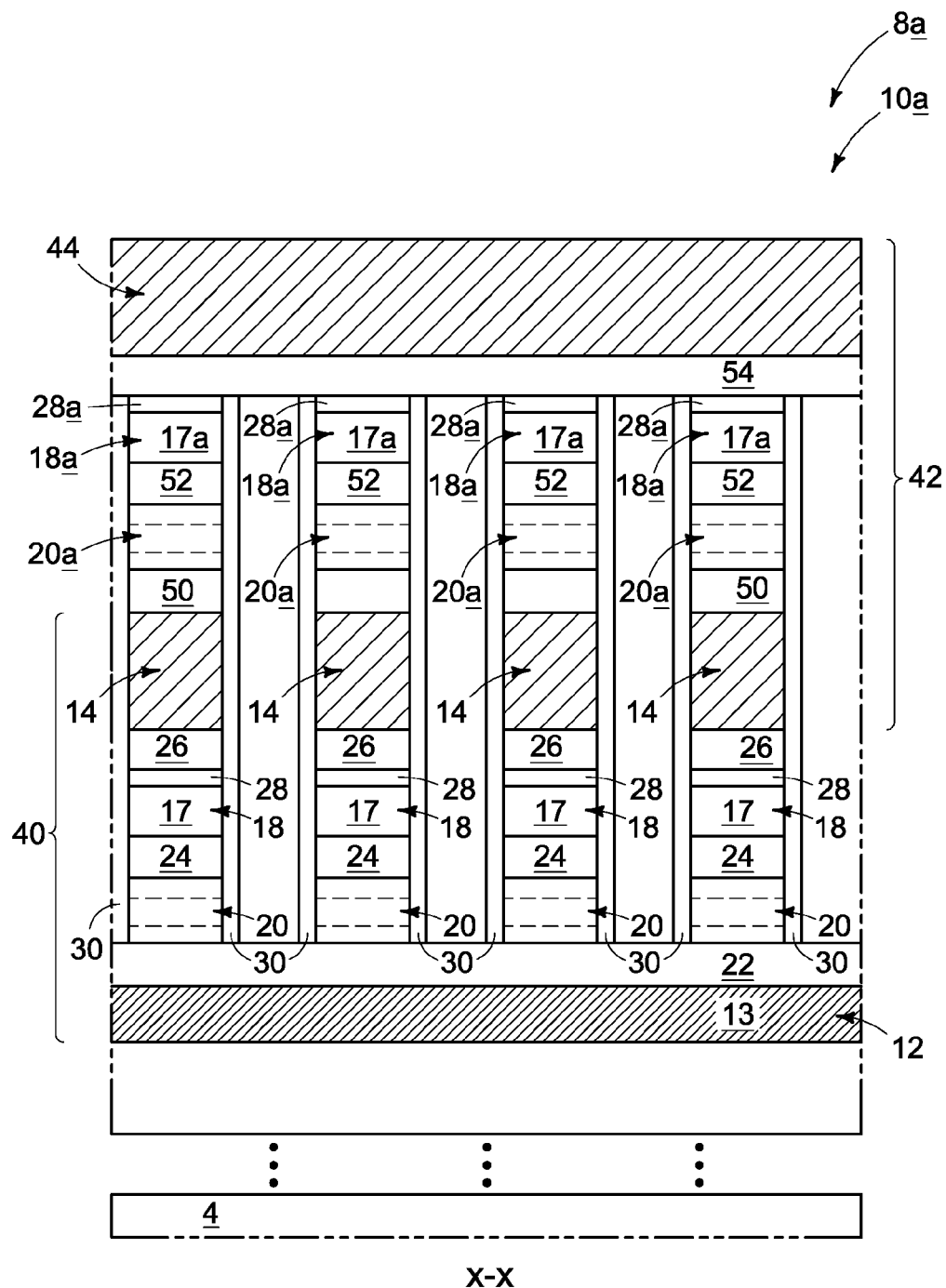

The memory array 10 may be considered to be an example of a 3-D cross-point memory architecture in some embodiments, and the illustrated memory cells 18 may correspond to a level (or tier) of memory cells within the 3-D architecture. FIGS. 2, 2A and 2B show a construction 8a comprising an example embodiment memory array 10a in which memory cells 18 are part of a first tier 40 of integrated memory, and in which an additional tier 42 of integrated memory is provided over such first tier.

The tier 42 comprises a series of third access/sense lines 44 in combination with the series of second access/sense lines 14. The third access/sense lines may comprise any of the materials described above as being suitable for access/sense lines 12 and 14. In some embodiments the third access/sense lines may comprise the same composition as one or both of access/sense lines 12 and 14; and in some embodiments the access/sense lines 44 may comprise a different composition than at least one of the access/sense lines 12 and 14. The third access/sense lines 44 may be considered to form a third series of access/sense lines in some embodiments, to distinguish such series from the first and second series of access/sense lines 12 and 14.

The third access/sense lines 44 extend along a direction which crosses the second access/sense lines 14. In the shown embodiment, the third access/sense lines 44 extend along the same direction as the first access/sense lines 12, and specifically extend along the direction of axis 5. Accordingly, in the shown embodiment the third access/sense lines 44 extend substantially orthogonally to the second access/sense lines 14.

The second tier 42 comprises programmable material 17a and optional buffer material 28a. The materials 17a and 28a may comprise any of the compositions discussed above as being suitable for materials 17 and 28, respectively. In some embodiments, programmable material 17a may be a same composition as programmable material 17, and in other embodiments may be a different composition than programmable material 17. Similarly, in some embodiments material 28a may be a same composition as material 28, and in other embodiments may be a different composition than material 28.

The programmable material 17a is incorporated into memory cells 18a. In some embodiments, the memory cells 18 may be considered to be a first level of memory cells and the memory cells 18a may be considered to be a second level of memory cells; with the second level of memory cells being in a different integrated circuit tier than the first level of memory cells. The programmable material 17 within the first level of memory cells may be considered to be a first programmable material, and the programmable material 17a within the second level of memory cells may be considered to be a second programmable material.

The memory cells 18 within the first level are each uniquely addressed by a combination of an access/sense line 12 from the first series and an access/sense line 14 from the second series. Similarly, the memory cells 18a are each uniquely addressed by a combination of an access/sense line 14 from the second series and an access/sense line 44 from the third series. In the shown embodiment, the access/sense line 14 is shared between the tiers 40 and 42 of integrated memory. In some embodiments, the access/sense line 14 may be a shared bitline, and the access/sense lines 12 and 44 may be wordlines.

The second tier 42 comprises resistance-increasing materials 50, 52 and 54. Such materials are more resistive than the access/sense lines 12, 14 and 44; and may comprise the same compositions as described above relative to resistance-increasing materials 22, 24 and 26. The materials 50, 52 and 54 may be the same as one another; or one or more of the materials may be different from one another. Further, some or all of materials 50, 52 and 54 may be the same as some or all of materials 22, 24 and 26; and/or some or all of materials 50, 52 and 54 may be different from some or all of materials 22, 24 and 26. In some embodiments, all of materials 22, 24, 26, 50, 52 and 54 comprise, consist essentially of, or consist of carbon.

The resistance-increasing material 50 is directly against, and coextensive with, the access/sense lines 14; and the resistance-increasing material 54 is directly against, and coextensive with, the access/sense lines 44.

The embodiment of FIGS. 2, 2A and 2B has two tiers 40 and 42 of integrated memory. In some embodiments, the access/sense lines 12, 14 and 44 may be a wordline, bitline and wordline, respectively; and the stacked tiers 40 and 42 may be considered to form a wordline/bitline/wordline unit. Multiple wordline/bitline/wordline units may be vertically stacked to form highly integrated 3-D memory.

The memory architectures of FIGS. 1 and 2 may be formed utilizing any suitable processing. Example processing which may be utilized to form the architecture of FIG. 1 is described with reference to FIGS. 3-8.

Figure 3:
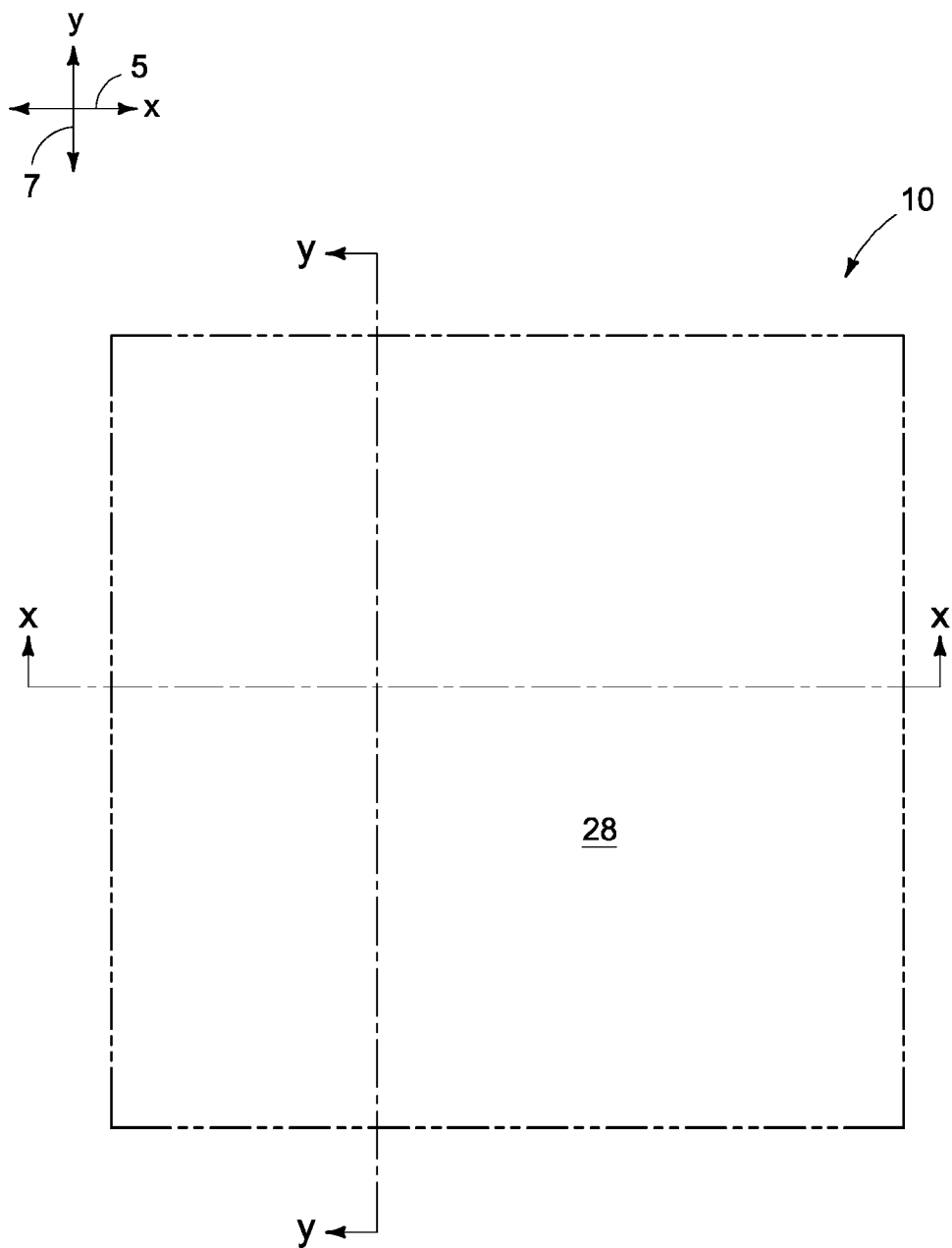
FIGS. 3, 3A and 3B are a top view and a pair of cross-sectional side views of a region of a semiconductor construction at a processing stage of an example embodiment method of forming a memory array. The views of FIGS. 3A and 3B are along the lines y-y and x-x of FIG. 3, respectively.
Figure 3A:
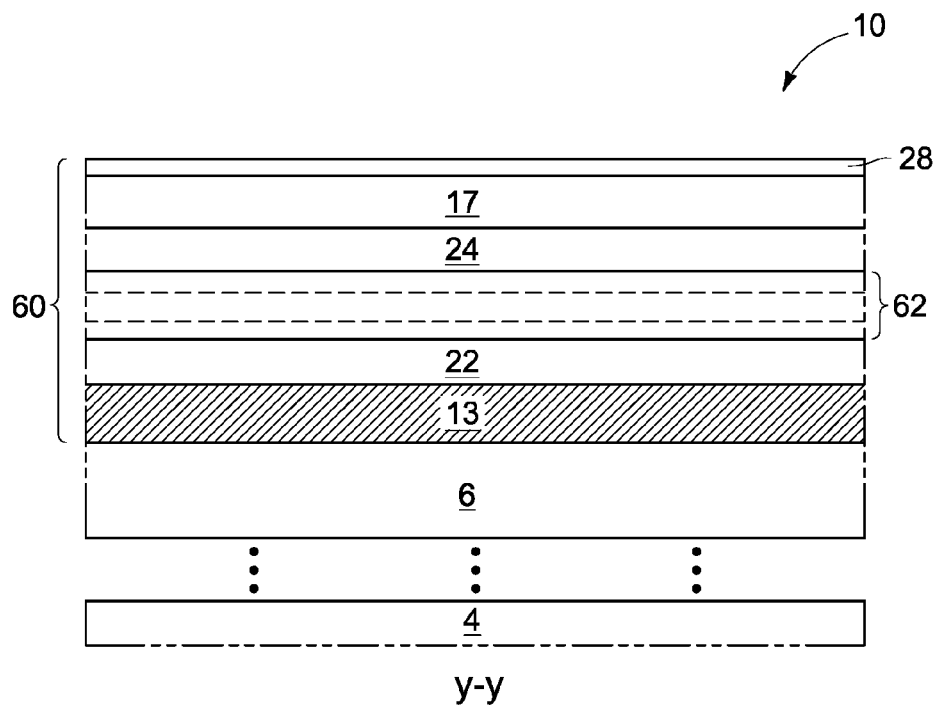
Figure 3B:
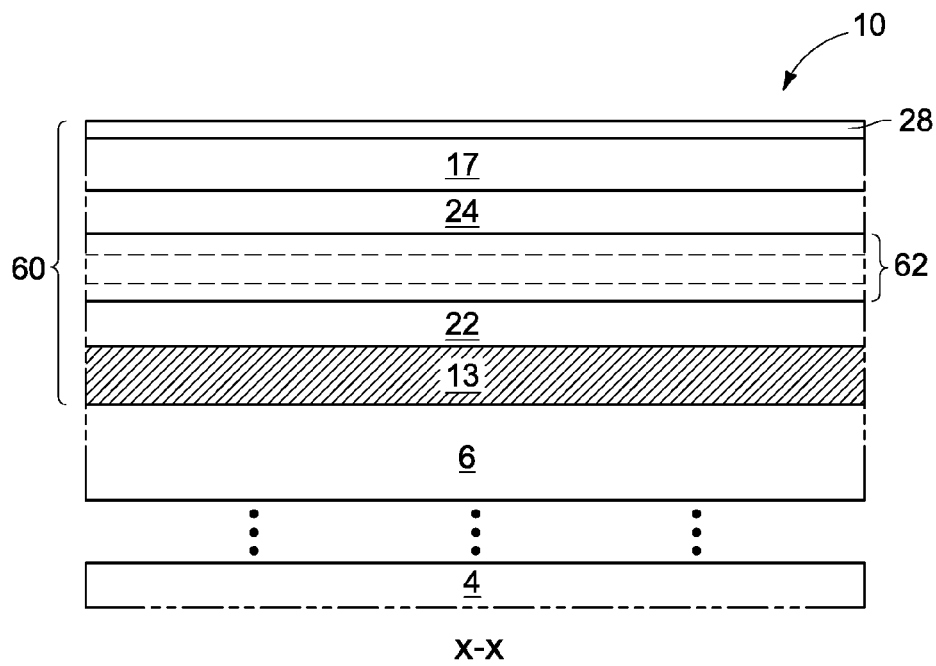

Referring to FIGS. 3, 3A and 3B, construction 10 is shown at a processing stage in which a stack 60 has been formed over insulative material 6. The stack comprises the access/sense material 13, resistance-increasing material 22, materials 62 of the select devices 20 (devices 20 are shown in FIGS. 1 and 1B), resistance-increasing material 24, programmable material 17, and buffer material 28.

Figure 4:
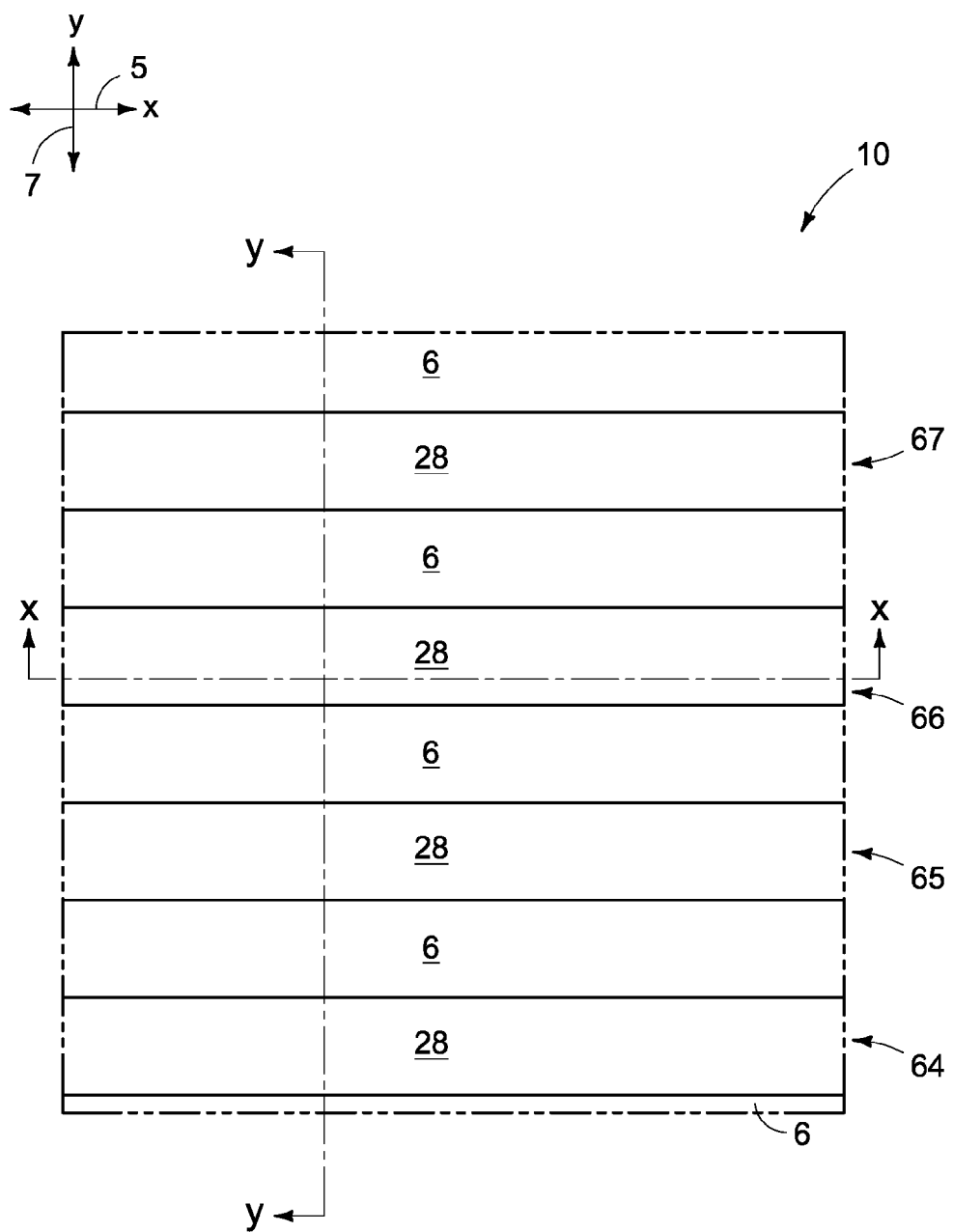
FIGS. 4, 4A and 4B are a top view and a pair of cross-sectional side views of the semiconductor construction of FIGS. 3, 3A and 3B at a processing stage subsequent to that of FIGS. 3, 3A and 3B. The views of FIGS. 4A and 4B are along the lines y-y and x-x of FIG. 4, respectively.
Figure 4A:
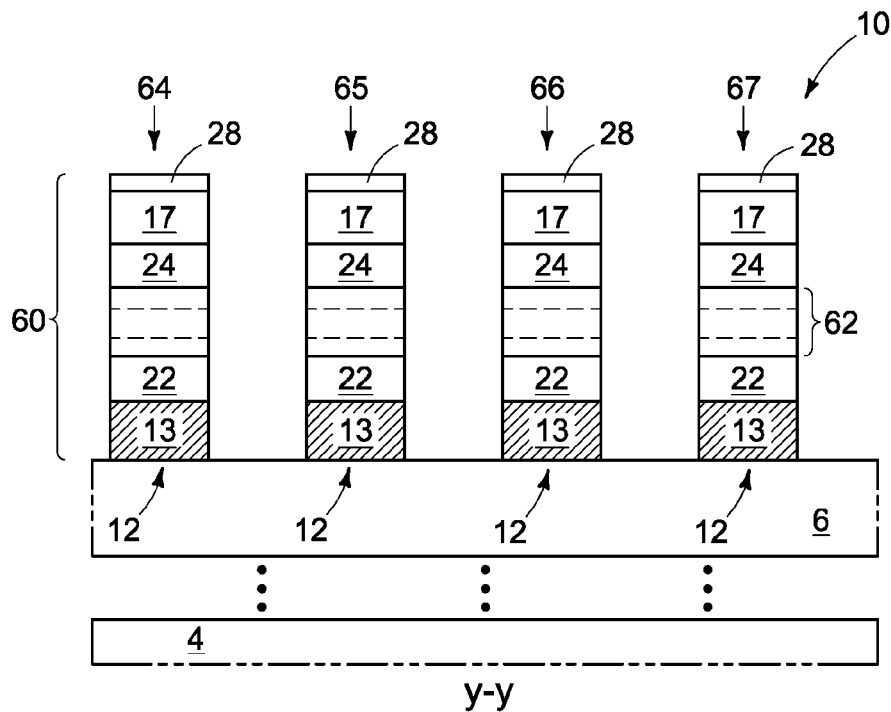
Figure 4B:
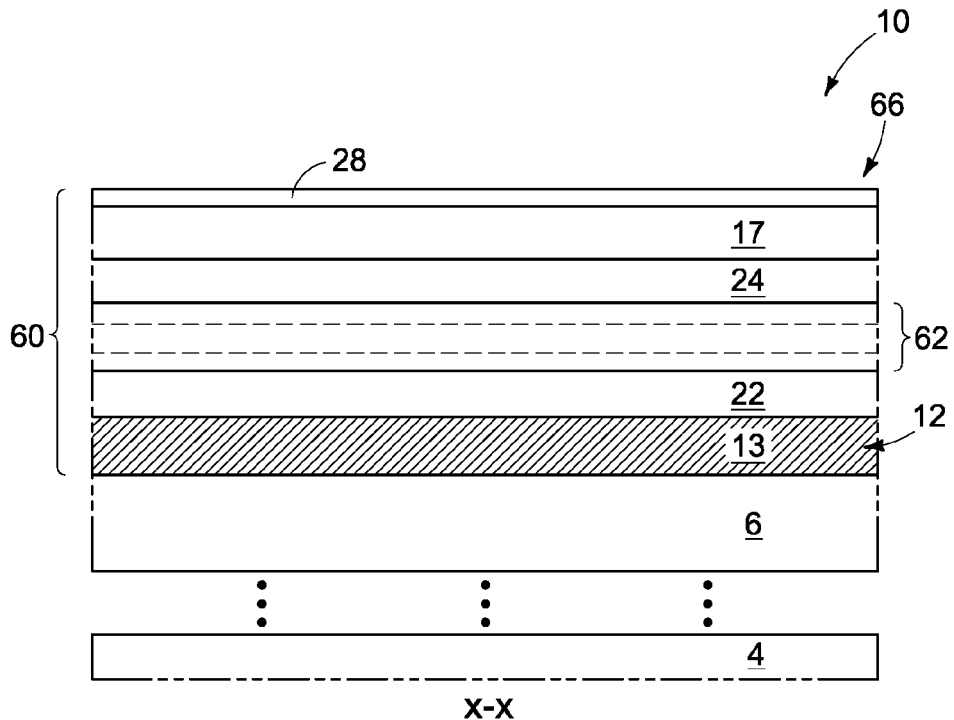

Referring to FIGS. 4, 4A and 4B, stack 60 is patterned into a first series of lines 64-67 extending along the first-direction of axis 5. Such patterning may be accomplished utilizing any suitable processing. For instance, a patterned mask (not shown) and hardmask (not shown) may be formed over stack 60. The patterned mask may define locations of the lines, and then one or more etches (for instance, one or more dry etches) may be conducted to transfer a pattern from the patterned mask into the hardmask, and then from the hardmask into materials of stack 60. Subsequently, the patterned mask and hardmask may be removed to leave the construction of FIGS. 4, 4A and 4B. The patterned mask may be a lithographic mask (for instance, photolithographically-patterned photoresist) or a sublithographic mask (for instance, a mask formed utilizing pitch-modification methodologies). In some embodiments, insulative materials shown in FIG. 5 may be formed over the patterned mask and hardmask, and then planarization (for instance, chemical-mechanical polishing [CMP]) may be utilized to remove the masks and insulative materials from over patterned lines 64-67.

The patterning of stack 60 forms material 13 into the access/sense lines 12 extending along the direction of axis 5, and forms resistance-increasing material 22 into lines coextensive with the access/sense lines 12.

Figure 5:
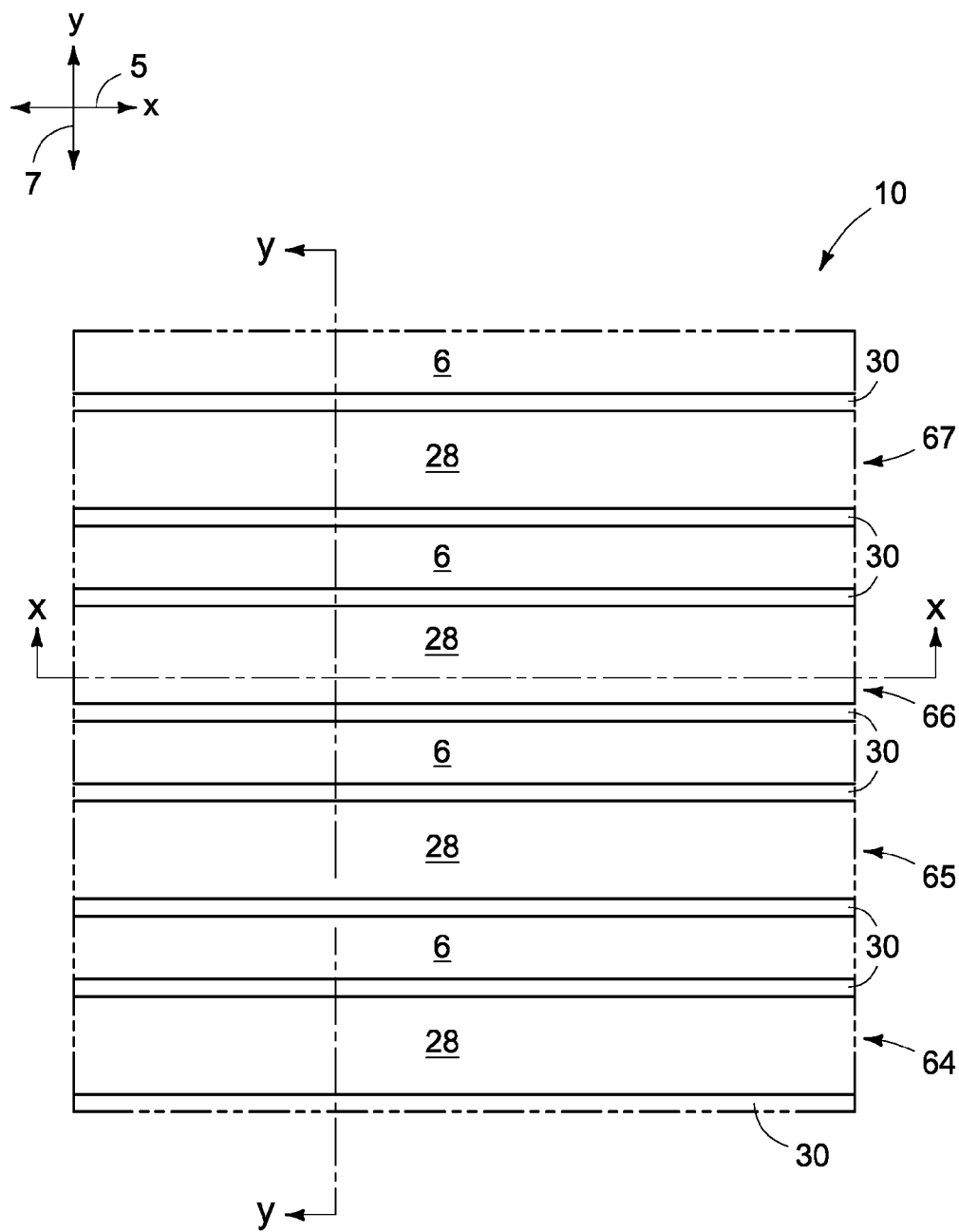
FIGS. 5, 5A and 5B are a top view and a pair of cross-sectional side views of the semiconductor construction of FIGS. 3, 3A and 3B at a processing stage subsequent to that of FIGS. 4, 4A and 4B. The views of FIGS. 5A and 5B are along the lines y-y and x-x of FIG. 5, respectively.
Figure 5A:
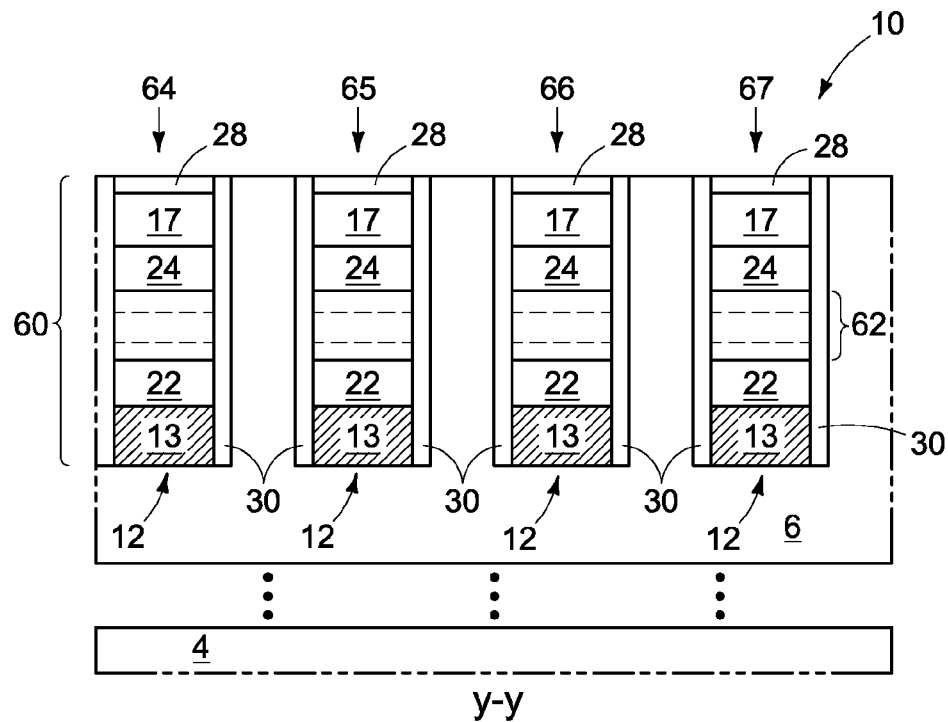
Figure 5B:
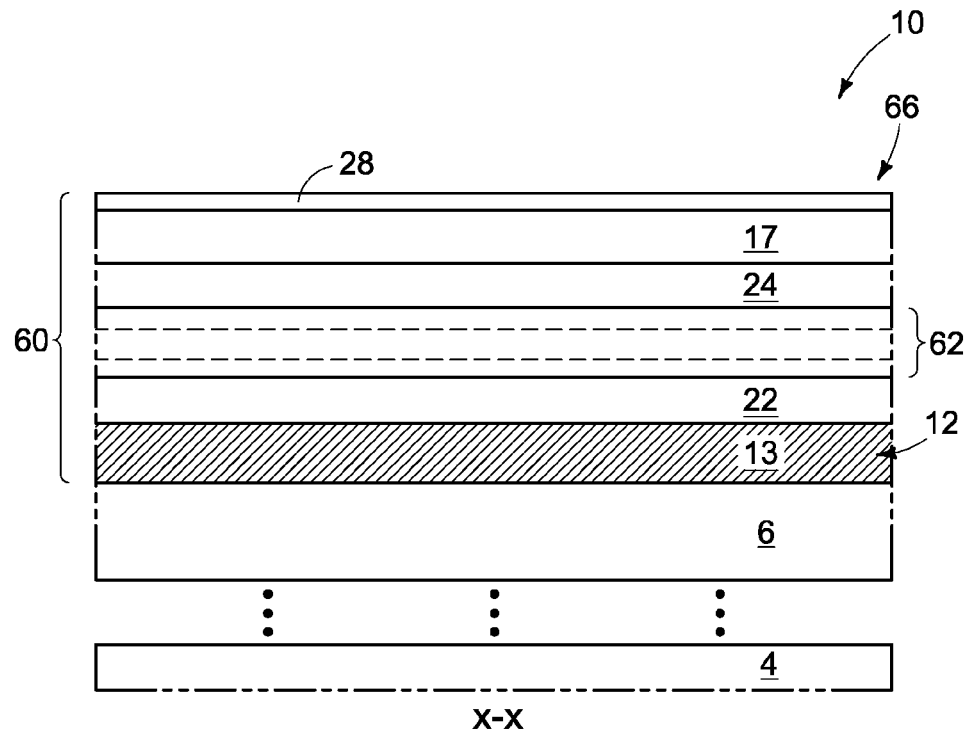

Referring to FIGS. 5, 5A and 5B, insulative materials 6 and 30 are formed between lines 64-67. The insulative materials may be formed utilizing any suitable processing. For instance, insulative materials 30 and 6 may be deposited over and between the lines, and then removed from over the lines utilizing CMP (or other suitable planarization) stopping on metal-containing material 28. Although the same insulative material 6 is shown formed between lines 64-67 as was initially provided beneath access/sense material 13, in other embodiments a different insulative material may be formed between the lines than is provided beneath material 13. The material 30 may have the shown configuration, or may be configured to extend across an upper surface of lower material 6 (FIG. 4A) along the cross-section of FIG. 5A.

Figure 6:
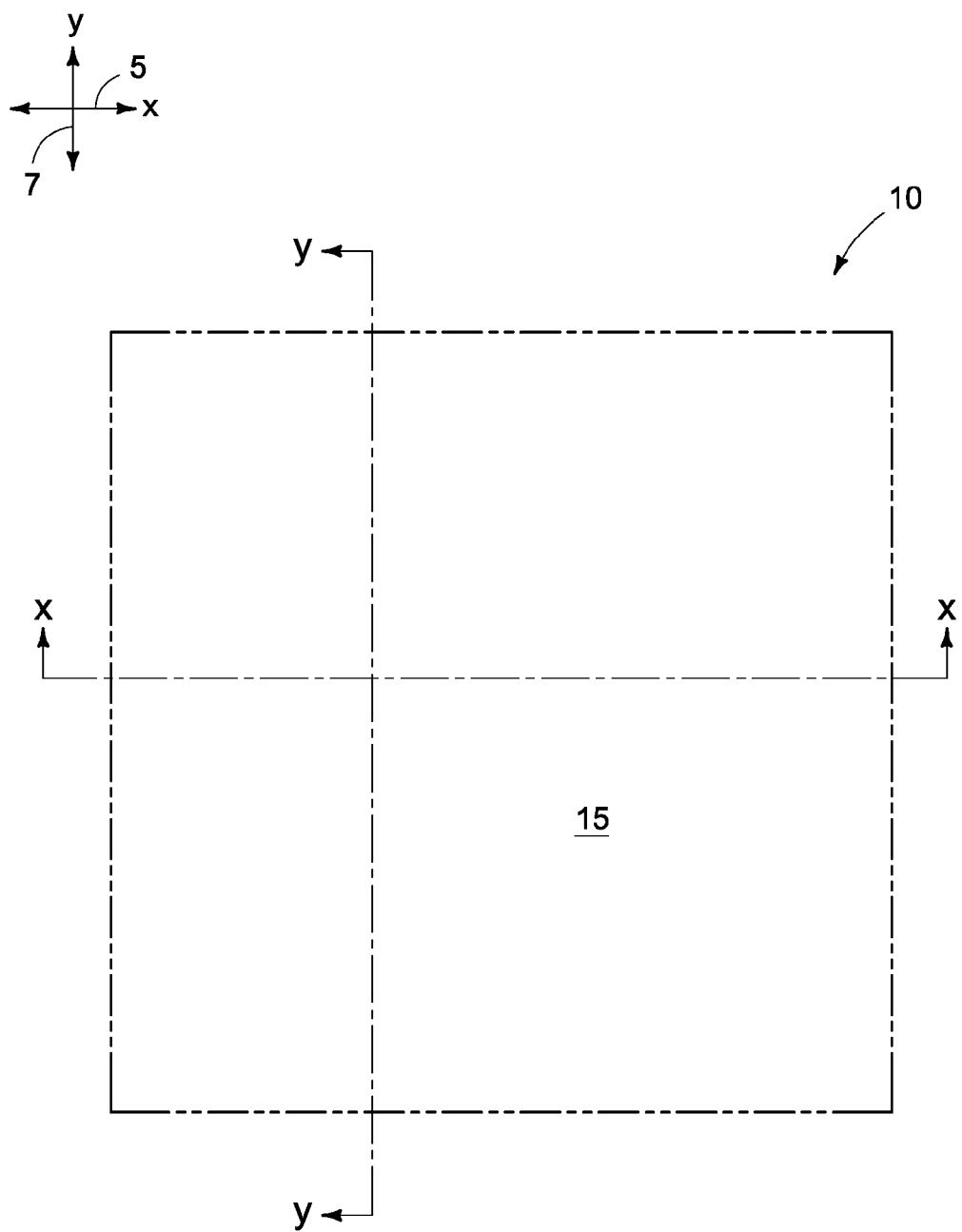
FIGS. 6, 6A and 6B are a top view and a pair of cross-sectional side views of the semiconductor construction of FIGS. 3, 3A and 3B at a processing stage subsequent to that of FIGS. 5, 5A and 5B. The views of FIGS. 6A and 6B are along the lines y-y and x-x of FIG. 6, respectively.
Figure 6A:
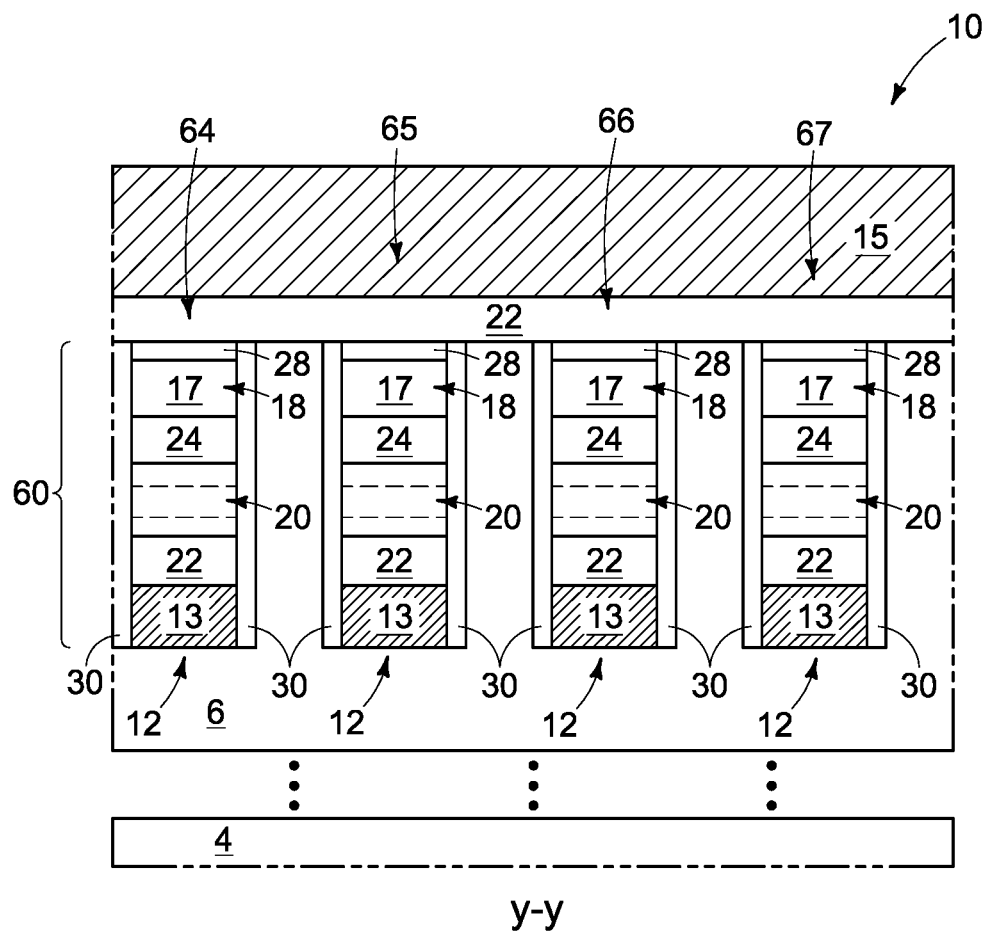
Figure 6B:
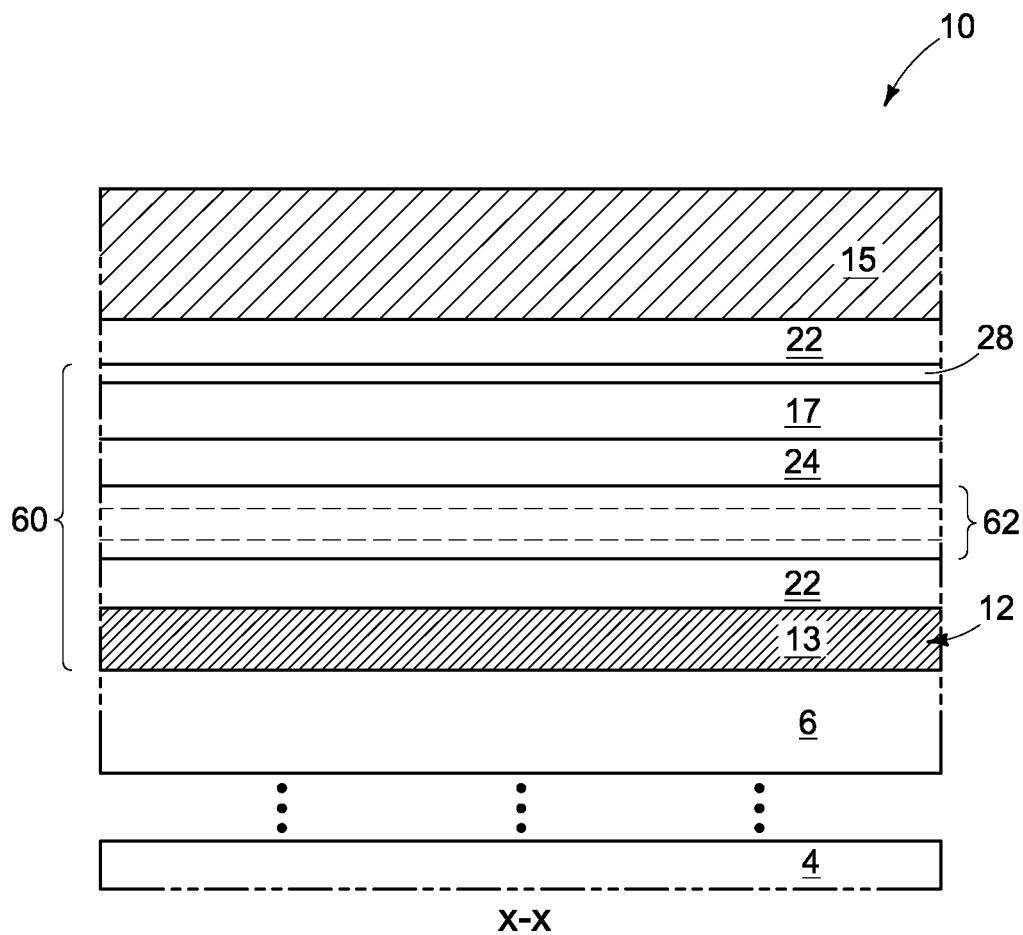

Referring to FIGS. 6, 6A and 6B, the third resistance-increasing material 22 is formed over stack 60, and the second access/sense material 15 is formed over the third resistance-increasing material 22.

Figure 7:
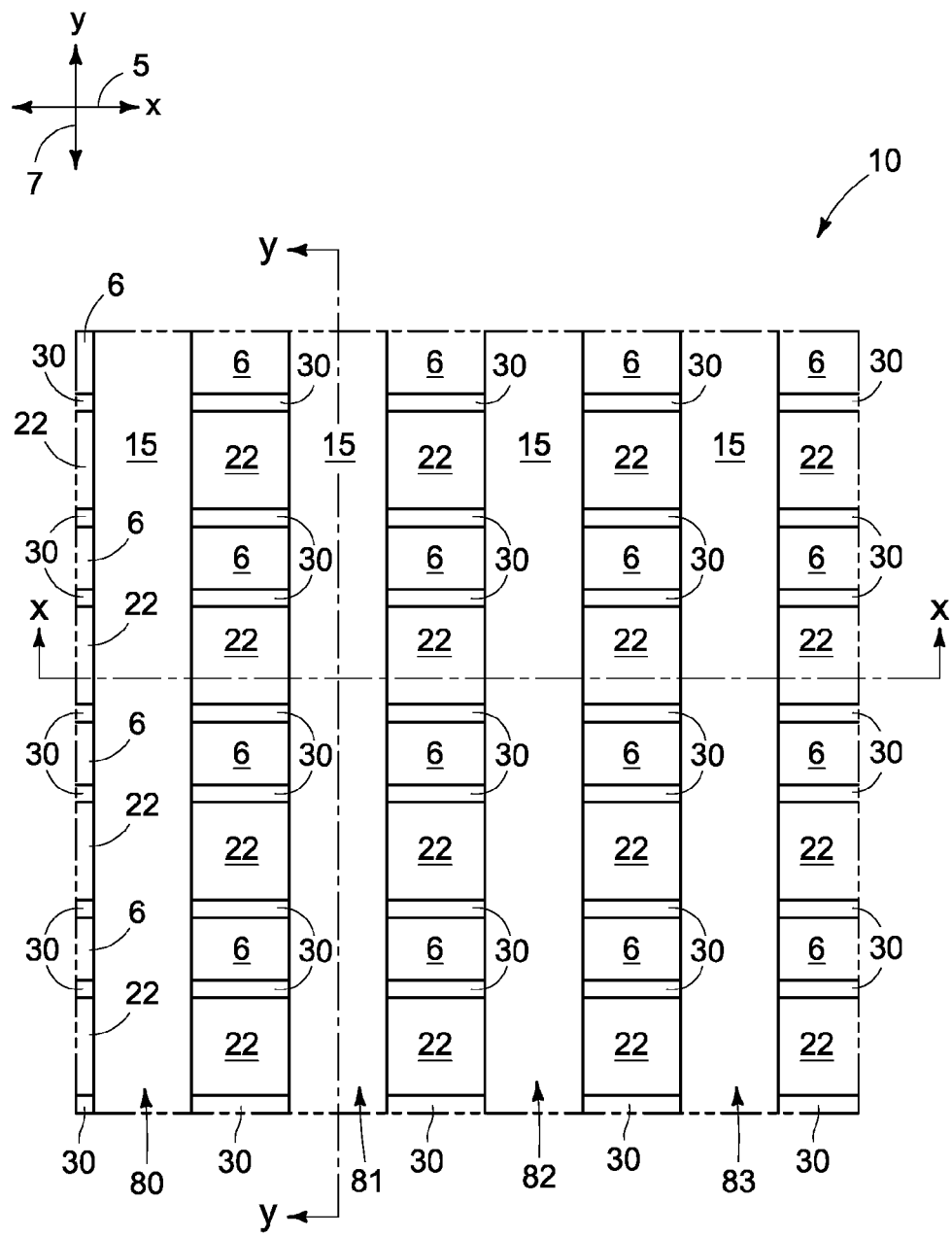

Referring to FIGS. 7, 7A and 7B, materials 15 and 22 are patterned into a second series of lines 81-83. In the shown embodiment, the second series of lines is substantially orthogonal to the first series of lines 64-67 (FIGS. 5, 5A and 5B), with the second series of lines extending along the second-direction of axis 7. Such patterning forms material 15 into the access/sense lines 14 extending along the direction of axis 7, and forms resistance-increasing material 26 into lines coextensive with the access/sense lines 14.

A pattern of lines 81-83 is transferred partially into stack 60, and specifically is transferred through materials 62, 24, 17 and 28 of the stack. Such singulates programmable material 17 into individual memory cells 18, and singulates the select materials 62 into the individual select devices 20.

The patterning of FIGS. 7, 7A and 7B may be accomplished utilizing any suitable processing. For instance, a patterned mask (not shown) and hardmask may be formed over material 15. The patterned mask may define locations of the lines, and may be utilized to pattern the hardmask; which may in turn be utilized to pattern the materials 15, 26, 28, 17, 24 and 62. Subsequently, the masks may be removed to leave the construction of FIGS. 7, 7A and 7B. The patterned mask may be a lithographic mask (for instance, photolithographically-patterned photoresist) or a sublithographic mask (for instance, a mask formed utilizing pitch-modification methodologies). In some embodiments, insulative materials shown in FIG. 8 may be formed over the patterned mask and hardmask, and then planarization (for instance, CMP) may be utilized to remove the masks and insulative materials from over patterned material 15.

Figure 8:
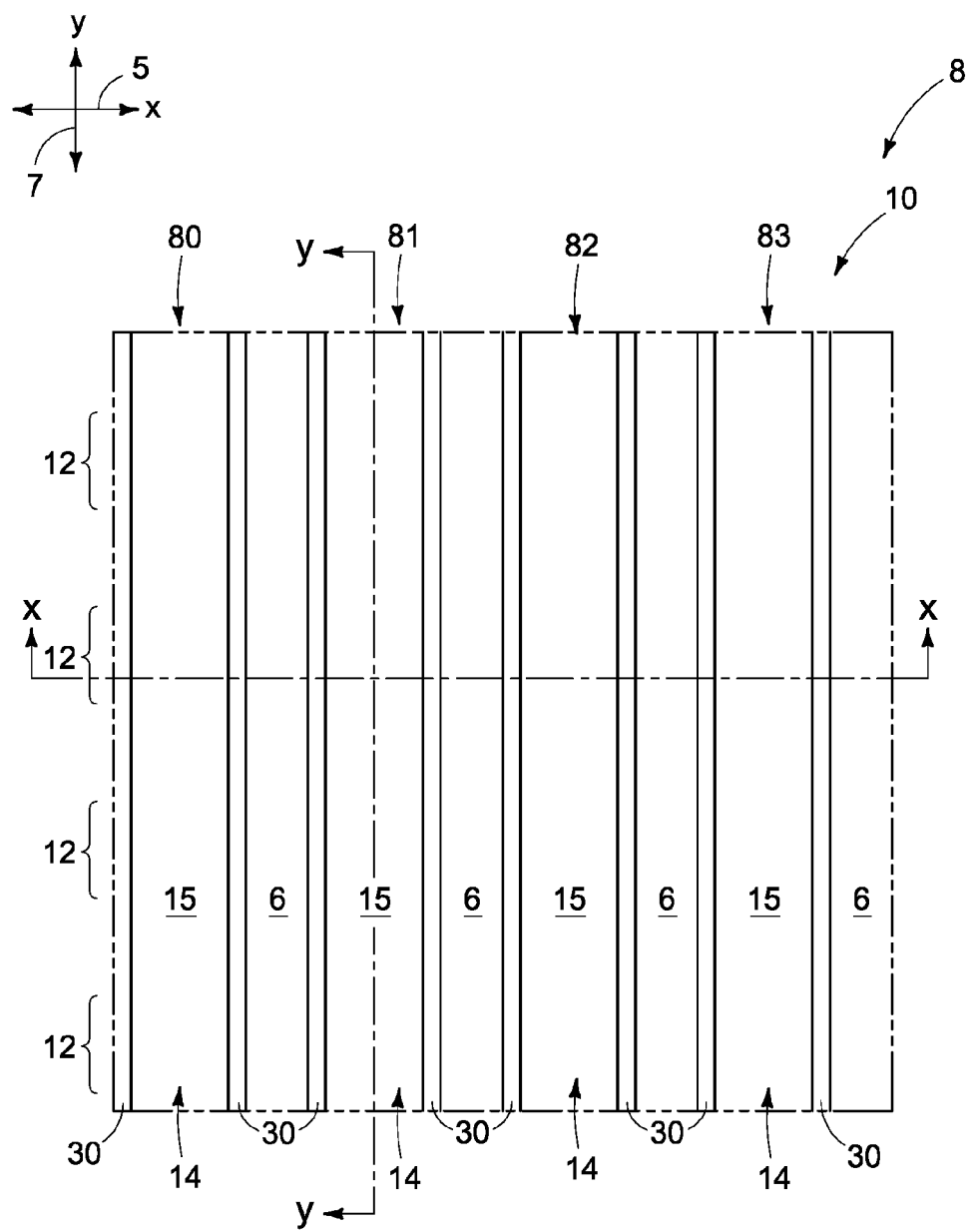
FIGS. 8, 8A and 8B are a top view and a pair of cross-sectional side views of the semiconductor construction of FIGS. 3, 3A and 3B at a processing stage subsequent to that of FIGS. 7, 7A and 7B. The views of FIGS. 8A and 8B are along the lines y-y and x-x of FIG. 8, respectively.
Figure 8A:
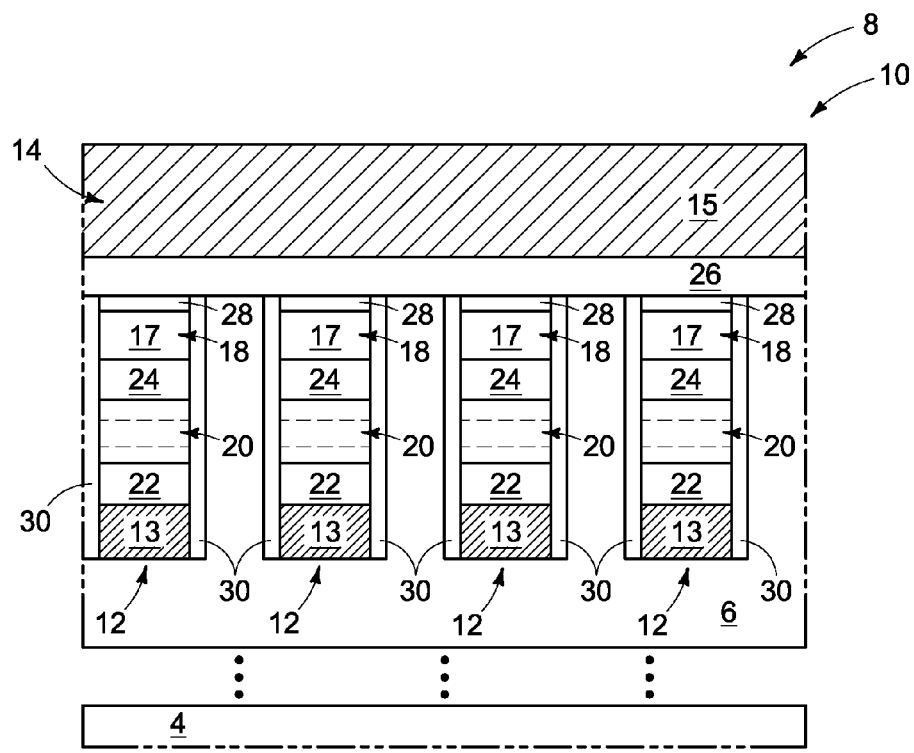
Figure 8B:
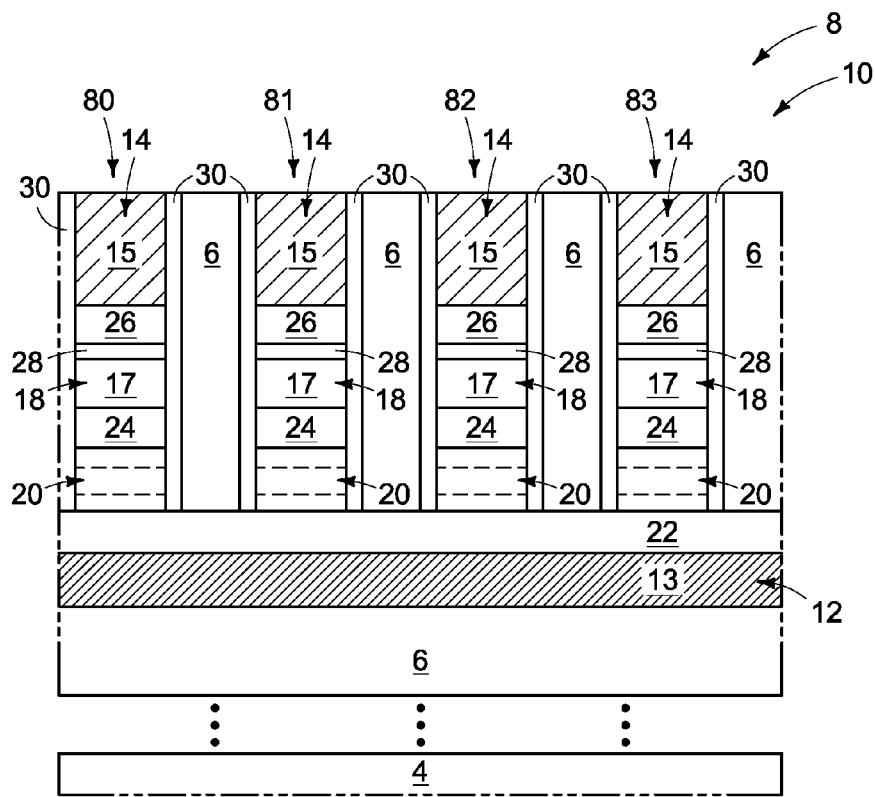

Referring to FIGS. 8, 8A and 8B, insulative materials 6 and 30 are formed between lines 80-83. The insulative materials may be formed utilizing any suitable processing. For instance, insulative materials 30 and 6 may be deposited over and between the lines, and then removed from over the lines utilizing CMP stopping on material 15. Although the same insulative materials 6 and 30 are shown formed between lines 80-83 as were formed between lines 64-67 (FIGS. 5, 5A and 5B), in other embodiments different insulative materials may be formed between the lines 80-83 than are formed between lines 64-67. The material 30 may have the shown configuration, or may be configured to extend across an upper surface of material 22 along the cross-section of FIG. 8B.

The construction 10 of FIGS. 8, 8A and 8B comprises the memory array 8 described above with reference to FIGS. 1, 1A and 1B.

The memory cells and arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a memory array which comprises a first series of access/sense lines extending along a first direction; and a second series of access/sense lines over the first series of access/sense lines and extending along a second direction which crosses the first direction. Memory cells are vertically between the first and second series of access/sense lines. The memory cells comprise programmable material. Each memory cell is uniquely addressed by a combination of an access/sense line from the first series and an access/sense line from the second series. Resistance-increasing material is coextensive with the access/sense lines of one of the first and second series and is more resistive than the access/sense lines of said one of the first and second series. The resistance-increasing material is between the access/sense lines of said one of the first and second series and the programmable material.

Some embodiments include a memory array which comprises a first series of access/sense lines extending along a first direction; and a second series of access/sense lines over the first series of access/sense lines and extending along a second direction which crosses the first direction. A first level of memory cells is vertically between the first and second series of access/sense lines. The first level memory cells comprises first programmable material. Each memory cell of the first level is uniquely addressed by a combination of an access/sense line from the first series and an access/sense line from the second series. First resistance-increasing material is under and coextensive with the access/sense lines of the second series and is more resistive than the access/sense lines of the second series. The first resistance-increasing material is between the access/sense lines of the second series and the first programmable material. A third series of access/sense lines is over the second series of access/sense lines and extends along a third direction which crosses the second direction. A second level of memory cells is vertically between the second and third series of access/sense lines. The second level memory cells comprise second programmable material. Each memory cell of the second level is uniquely addressed by a combination of an access/sense line from the second series and an access/sense line from the third series. Second resistance-increasing material is under and coextensive with the access/sense lines of the third series and is more resistive than the access/sense lines of the third series. The second resistance-increasing material is between the access/sense lines of the third series and the second programmable material.

Some embodiments include a method of forming a memory array. A stack is formed which comprises programmable material over first access/sense material. The stack is patterned into a first series of lines extending along a first direction. Resistance-increasing material is formed over the stack. Second access/sense material is formed over the resistance-increasing material. The resistance-increasing material is more resistive than the first and second access/sense materials. The resistance-increasing material and the second access/sense material are patterned into a second series of lines extending along a second direction which crosses the first direction. A pattern of the second series of lines is extended through the programmable material of the first series of lines to singulate the programmable material into individual memory cells.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a memory array, comprising:
   forming a stack comprising programmable material over first access/sense material and select device materials between the first access/sense material and the programmable material;
   patterning the stack into a first series of lines extending along a first direction;
   forming resistance-increasing material over the stack;
   forming second access/sense material over the resistance-increasing material; the resistance-increasing material being more resistive than the first and second access/sense materials; and
   patterning the resistance-increasing material and the second access/sense material into a second series of lines extending along a second direction which crosses the first direction; a pattern of the second series of lines being extended through the programmable material of the first series of lines to singulate the programmable material into individual memory cells and singulate the select device materials into individual select devices; wherein the resistance-increasing material is a third resistance-increasing material, and wherein the stack comprises first resistance-increasing material between the first access/sense material and the select device materials, and comprises second resistance-increasing material between the select device materials and the programmable material.

2. The method of claim 1 wherein the first, second and third resistance-increasing materials are a same composition as one another.

3. The method of claim 2 wherein the first, second and third resistance-increasing materials comprise carbon.

4. The method of claim 1 wherein the stack further comprises one or more metal-containing materials over the programmable material.

5. The method of claim 1 wherein the second direction is substantially orthogonal to the first direction.

6. The method of claim 1 wherein the programmable material comprises phase change material.

7. A method of forming a memory array, comprising:
   forming a first series of lines extending along a first direction, the first series of lines comprising one of wordlines and bitlines;
   forming a second series of lines over the first series of lines and extending along a second direction which crosses the first direction, the second series of lines comprising the other of wordlines and bitlines;
   forming memory cells vertically between the first and second series of lines; the memory cells comprising programmable material comprising phase change material, each memory cell being uniquely addressed by a combination of a line from the first series and a line from the second series;
   forming a first resistance-increasing material coextensive with the lines of the first series such that the resistance-increasing material is in direct physical contact with and covers an entirety of an upper surface of the lines of the first series, the resistance-increasing material being more resistive than the lines of said first series, the resistance-increasing material being between the lines of said first series and the programmable material and being directly against the lines of the first series, the first-resistance-increasing material being retained covering the entirety of the upper surface of the line of the first series in a final memory array structure; and forming a second resistance-increasing material linearly coextensive across the memory array with the lines of the second series.

8. The method of claim 7 wherein the programmable material comprises chalcogenide.

9. The method of claim 7 wherein the lines of the first series are wordlines and the lines of the second series are bitlines.

10. The method of claim 7 further comprising select devices between the lines of the first series and the memory cells.

11. The method of claim 7 wherein the resistance-increasing material comprises carbon.

12. The method of claim 7 wherein the first direction is substantially orthogonal to the second direction.

13. The method of claim 7 wherein the resistance-increasing material comprises titanium and nitrogen in combination with one or both of silicon and aluminum.

14. The method of claim 7 wherein the resistance-increasing material is a first resistance-increasing material, and further comprising a second resistance-increasing material linearly coextensive across the memory array with the lines of the second series and disposed directly against the programmable material of the memory cells.

15. The method of claim 7 wherein the resistance-increasing material is a first resistance-increasing material, and further comprising a second resistance-increasing material linearly coextensive across the memory array with the lines of the second series and spaced from the programmable material of the memory cells by one or more metal-containing materials.

16. A method of forming a memory array, comprising:

forming a first series of lines extending along a first direction, the first series of lines comprising one of wordlines and bitlines;

forming a second series of lines over the first series of lines and extending along a second direction which crosses the first direction, the second series of lines comprising the other of wordlines and bitlines;

forming memory cells vertically between the first and second series of lines; the memory cells comprising programmable material comprising phase change material, each memory cell being uniquely addressed by a combination of a line from the first series and a line from the second series;

forming a first resistance-increasing material coextensive with the lines of the first series such that the resistance-increasing material covers an entirety of an upper surface of the lines of the first series, the resistance-increasing material being more resistive than the lines of said first series, the resistance-increasing material being between the lines of said first series and the programmable material and being directly against the lines of the first series; and forming a second resistance-increasing material linearly coextensive across the memory array with the lines of the second series;

forming select devices over the first resistance-increasing material; and forming third resistance-increasing material between the select devices and the memory cells.

17. The method of claim 16 wherein at least two of the first, second and third resistance-increasing materials are a same composition as one another.

18. The method of claim 16 wherein all of the first, second and third resistance-increasing materials are a same composition as one another.

\* \* \* \* \*